(12) United States Patent
Yu et al.

(10) Patent No.: US 12,411,279 B2
(45) Date of Patent: Sep. 9, 2025

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Chen-Hua Yu, Hsinchu (TW); Jiun Yi Wu, Zhongli (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 341 days.

(21) Appl. No.: 18/111,290

(22) Filed: Feb. 17, 2023

(65) Prior Publication Data

US 2024/0077669 A1    Mar. 7, 2024

Related U.S. Application Data

(60) Provisional application No. 63/379,015, filed on Oct. 11, 2022, provisional application No. 63/374,798, filed on Sep. 7, 2022.

(51) Int. Cl.
*G02B 6/42* (2006.01)
*G02B 6/12* (2006.01)
*G02B 6/26* (2006.01)

(52) U.S. Cl.
CPC ......... *G02B 6/12004* (2013.01); *G02B 6/262* (2013.01); *G02B 6/4239* (2013.01); *G02B 2006/12102* (2013.01); *G02B 2006/12104* (2013.01)

(58) Field of Classification Search
CPC .............................. G02B 6/4239; G02B 6/4214
See application file for complete search history.

(56) References Cited

U.S. PATENT DOCUMENTS

| | | | |
|---|---|---|---|
| 2014/0203175 A1* | 7/2014 | Kobrinsky | G02B 6/4214 250/214.1 |
| 2017/0186670 A1 | 6/2017 | Budd et al. | |
| 2021/0088723 A1 | 3/2021 | Yu et al. | |
| 2021/0091056 A1 | 3/2021 | Yu et al. | |
| 2022/0043208 A1 | 2/2022 | Hsia et al. | |

FOREIGN PATENT DOCUMENTS

| | | |
|---|---|---|
| TW | 202113409 A | 4/2021 |
| TW | 202114087 A | 4/2021 |
| TW | 202212879 A | 4/2022 |

* cited by examiner

*Primary Examiner* — Chad H Smith
(74) *Attorney, Agent, or Firm* — Slater Matsil, LLP

(57) ABSTRACT

An embodiment is a package including a package substrate and a package component bonded to the package substrate, the package component including an interposer, an optical die bonded to the interposer, the optical die including an optical coupler, an integrated circuit die bonded to the interposer adjacent the optical die, a lens adapter adhered to the optical die with a first optical glue, a mirror adhered to the lens adapter with a second optical glue, the mirror being aligned with the optical coupler of the optical die, and an optical fiber on the lens adapter, a first end of the optical fiber facing the mirror, the optical fiber being configured such that an optical data path extends from the first end of the optical fiber through the mirror, the second optical glue, the lens adapter, and the first optical glue to the optical coupler of the optical die.

20 Claims, 30 Drawing Sheets

INTEGRATED CIRCUIT PACKAGE AND METHOD OF FORMING SAME

PRIORITY CLAIM AND CROSS-REFERENCE

This application claims the benefit of U.S. Provisional Application No. 63/379,015, filed on Oct. 11, 2022 and entitled "LAD (Lens Adopter) & PML (Photonic Mirror Lens) Design and Construction for CPO (Co-Package Optics) Application", and U.S. Provisional Application No. 63/374,798, filed Sep. 7, 2022, and entitled "LAD (Lens Adopter) & PML (Photonic Mirror Lens) Design and Construction for CPO (Co-Package Optics) Application", which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
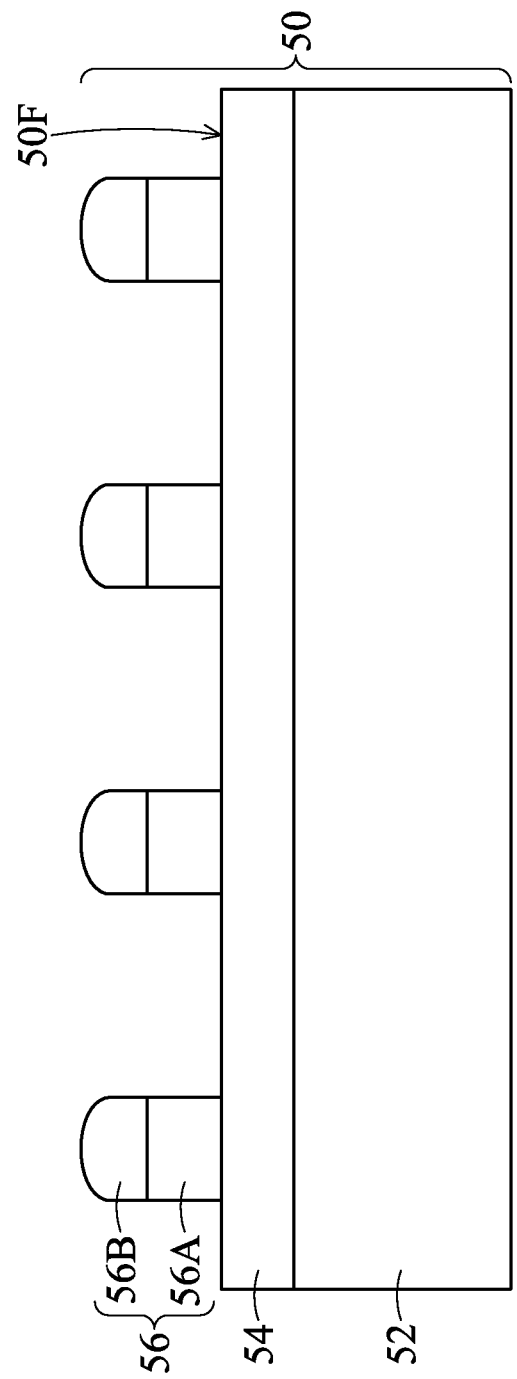
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to embodiments in a specific context, namely integrated circuit packages and methods of forming the same. In various embodiments presented herein, a package comprises a package component mounted on a package substrate. The package component may comprise an optical integrated circuit die attached to a redistribution structure or an interposer. The optical integrated circuit die may comprise an optical coupler, such as a grating coupler. Various embodiments presented herein allow for integration of optical integrated circuit dies comprising grating couplers, achieving high bandwidth with ultra-low power consumption through the grating coupler, and extensive integration for co-package. The embodiments include a lens adapter, a support structure, and a mirror. By including these components in specific configurations, the package structure can be more compact and utilize a lateral entry optical fiber to the package structure with a top surface entry to the optical engine for the optical data path from the optical fiber. Further, the optical loss from the optical fiber to the mirror is reduced as compared to other structures. In addition, the lens adapter and the mirror allow for the disclosed embodiments to be widely usable in various packaging configurations, such as multi-chip modules (MCM), chip-on-wafer-on-substrate packages, or integrated fan-out (InFO) packages.

FIG. 1 illustrates a cross-sectional view of an integrated circuit die 50, in accordance with some embodiments. Integrated circuit dies 50 will be packaged in subsequent processing to form integrated circuit packages. Each integrated circuit die 50 may be a logic device (e.g., application-specific integrated circuit (ASIC) die, central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, and conductive connectors 56.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active or a front-side surface (e.g., the surface facing upward) and an inactive or a backside surface (e.g., the surface facing downward). Devices are at the active surface of the semiconductor substrate 52. The devices may be active devices (e.g., transistors, diodes, etc.) and/or passive devices (capacitors, resistors, inductors, etc.). The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include low-k dielectric materials such as phospho-silicate glass (PSG), boro-silicate glass (BSG), boron-doped phospho-silicate glass (BPSG), undoped silicate glass (USG), or the like. Acceptable dielectric materials for the dielectric layers further include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Conductive connectors 56 are formed at the front-side 50F of the integrated circuit die 50. The conductive connectors 56 may comprise underbump metallizations (UBMs) 56A and solder regions 56B over the UBMs 56A. The UBMs 56A may be conductive pillars, pads, or the like. In some embodiments, the UBMs 56A may be formed by forming a seed layer over the interconnect structure 54. The seed layer may be a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 56A. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, nickel, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 56A.

In some embodiments, the UBMs 56A may include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 56A. Any suitable materials or layers of material that may be used for the UBMs 56A are fully intended to be included within the scope of the current application.

The solder regions 56B may comprise a solder material and may be formed over the UBMs 56A by dipping, printing, plating, or the like. The solder material may comprise, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free solders may further include SnCu compounds as well, without the use of silver (Ag). Lead-free solders may also include tin and silver, Sn—Ag, without the use of copper. In some embodiments, a reflow process may be performed, giving the solder regions 56B a shape of a partial sphere in some embodiments. In other embodiments, the solder regions 56B may have other shapes, such as non-spherical shapes.

In some embodiments, the solder regions 56B may be used to perform chip probe (CP) testing on the integrated circuit die 50. For example, the solder regions may be solder balls, solder bumps, or the like, which are used to attach a chip probe to the conductive connectors 56. Chip probe testing may be performed on the integrated circuit die 50 to ascertain whether the integrated circuit die 50 is a known good die (KGD). Thus, only integrated circuit dies 50, which are KGDs, undergo subsequent processing and are packaged, and dies which fail the chip probe testing are not packaged. In some embodiments, after testing, the solder regions 56B may be removed in subsequent processing steps.

Figure 2:
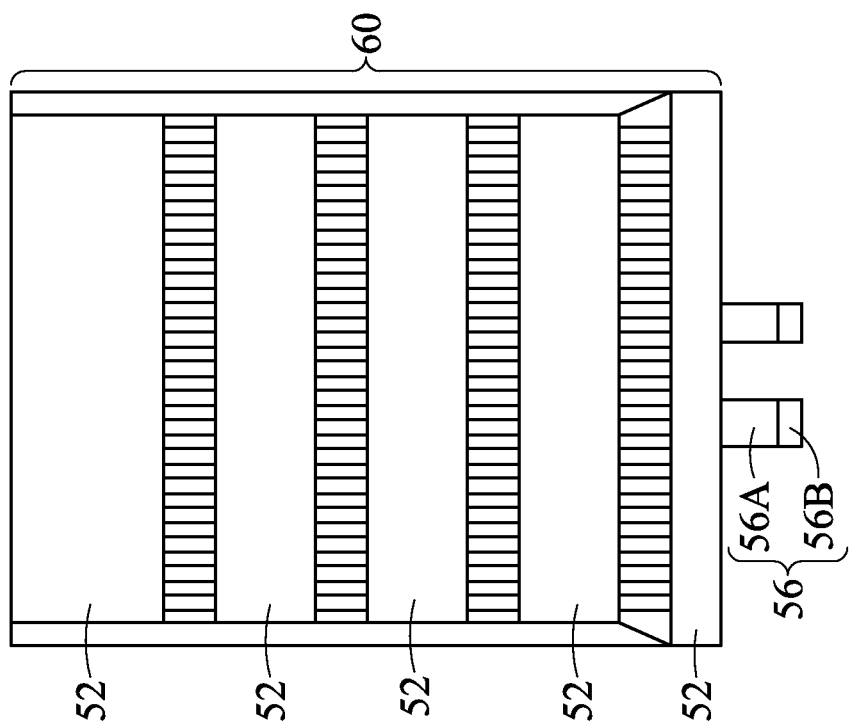
FIG. 2 illustrates a cross-sectional view of an integrated circuit die, in accordance with some embodiments.

FIG. 2 illustrates a cross-sectional view of an integrated circuit die 60, in accordance with some embodiments. The integrated circuit die 60 is a stacked device that includes multiple semiconductor substrates 52. For example, the integrated circuit die 60 may be a memory device that includes multiple memory dies such as a hybrid memory cube (HMC) device, a high bandwidth memory (HBM) device, or the like. In such embodiments, the integrated circuit die 60 includes multiple semiconductor substrates 52 interconnected by through-substrate vias (TSVs) such as through-silicon vias (not shown). Each of the semiconductor substrates 52 may (or may not) have a separate interconnect structure.

Figure 3:
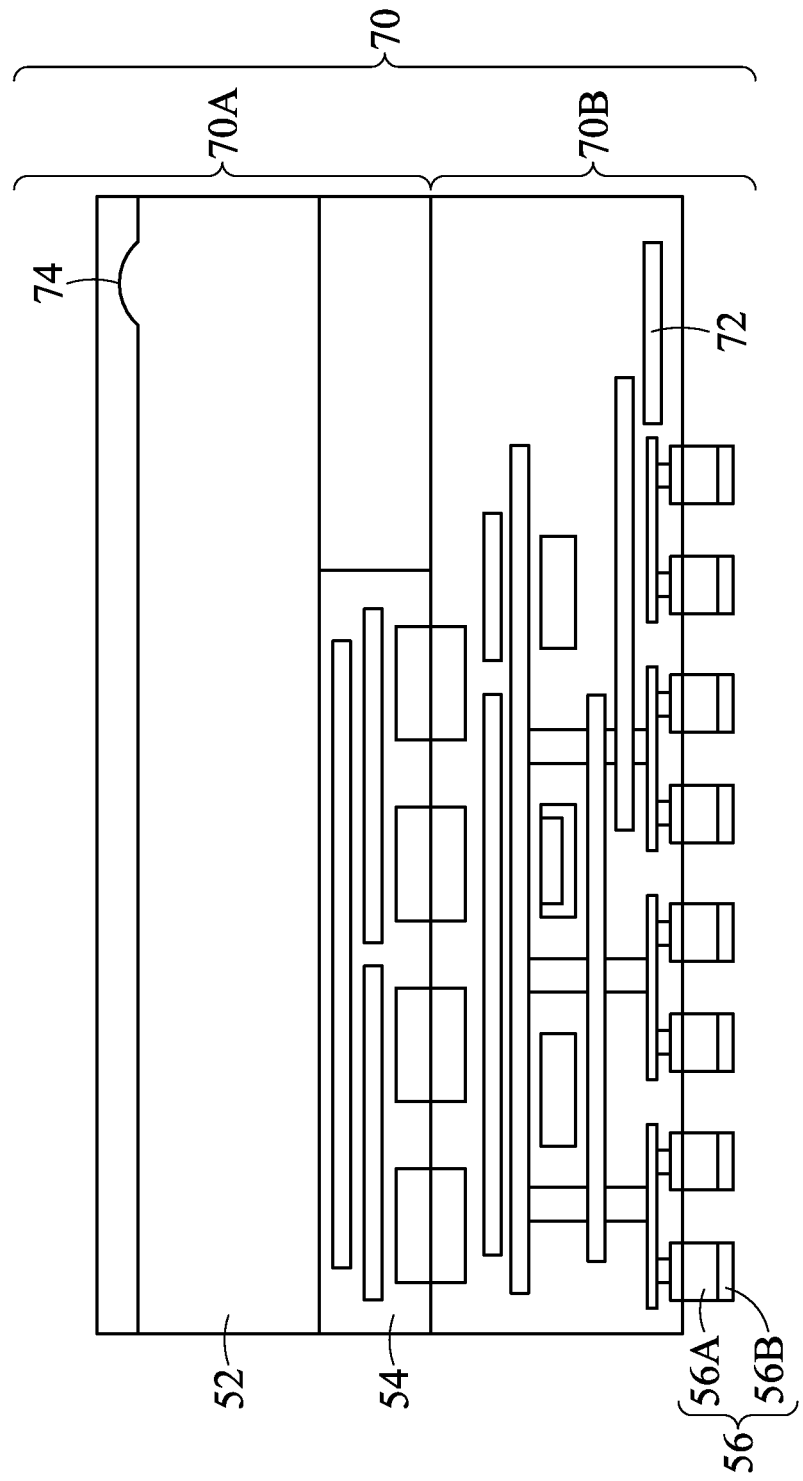
FIG. 3 illustrates a cross-sectional view of an integrated circuit die, in accordance with some embodiments.

FIG. 3 illustrates a cross-sectional view of an integrated circuit die 70, in accordance with some embodiments. The integrated circuit die 70 may be an optical integrated circuit die, such as an optical engine die. The integrated circuit die 70 may include an electrical integrated circuit (EIC) 70A bonded to a photonic integrated circuit (PIC) 70B. The EIC 70A may comprise a semiconductor substrate 52, active and/or passive electric devices on the active side of the semiconductor substrate 52, an interconnect structure 54 on the active side of the semiconductor substrate 52, and a lens 74 on the backside of the semiconductor substrate 52. The lens 74 may be formed by patterning the backside of the semiconductor substrate 52. The lens 74 may be formed to protrude from the backside of the semiconductor substrate 52 (see, e.g., FIG. 3) or to be recessed into the backside of the semiconductor substrate 52 (see, e.g., FIG. 25). The EIC 70A may be formed in a similar manner as the integrated circuit die 50 described above with reference to FIG. 1, and the description is not repeated herein.

The PIC 70B may comprise optical devices, such as waveguides, modulators, or the like. The PIC 70B may also include an optical coupler 72, such as a grating coupler. In some embodiments, the optical coupler 72 may comprise a dielectric material (such as, silicon nitride, or the like) and may be formed using physical vapor deposition (PVD), chemical vapor deposition (CVD), or the like. In other embodiments, the optical coupler 72 may comprise a semiconductor layer (such as, a silicon layer, or the like) and may be formed from an SOI substrate. The optical coupler 72 may be disposed within the PIC 70B. As described below with greater detail, the optical coupler 72 provides optical coupling between the integrated circuit die 70 and an optical fiber coupled to the integrated circuit die 70.

The integrated circuit die 70 may be formed in a wafer, which may include different die regions that are singulated in subsequent steps to form a plurality of integrated circuit dies 70. In some embodiments, the wafer may be formed by hybrid bonding an EIC wafer (comprising a plurality of EICs 70A) to a PIC wafer (comprising a plurality of PICs 70B).

Figure 4:
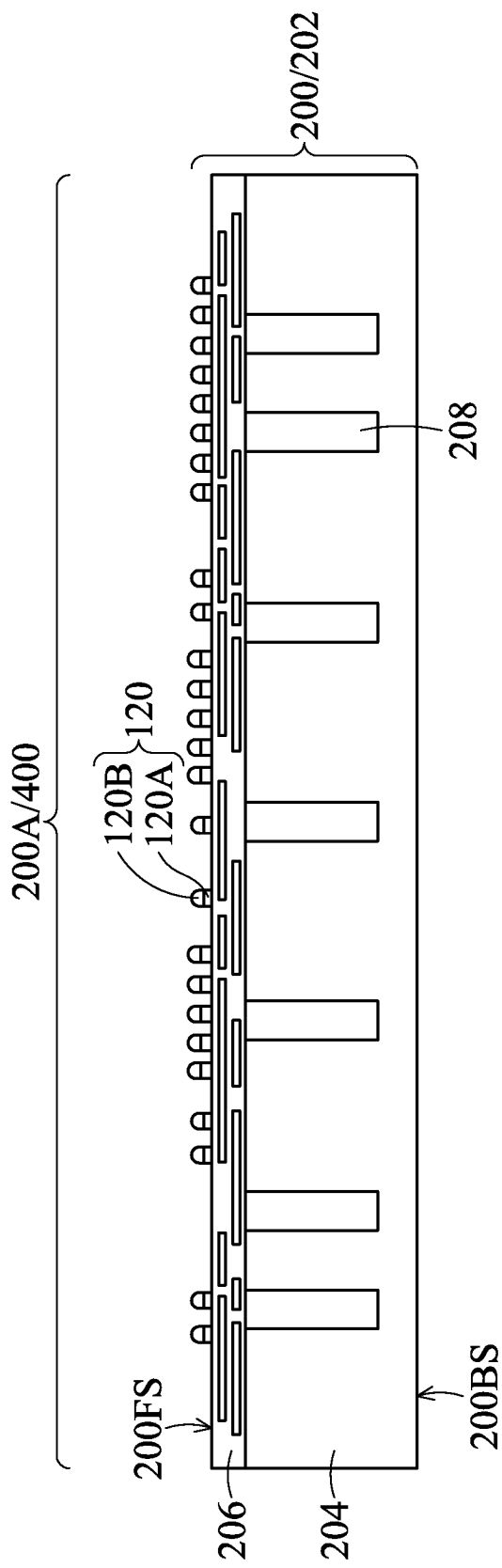
FIGS. 4-9, 10A, 10B, and 11-15 illustrate plan and cross-sectional views of intermediate stages in the manufacturing of package components, in accordance with some embodiments.
Figure 5:
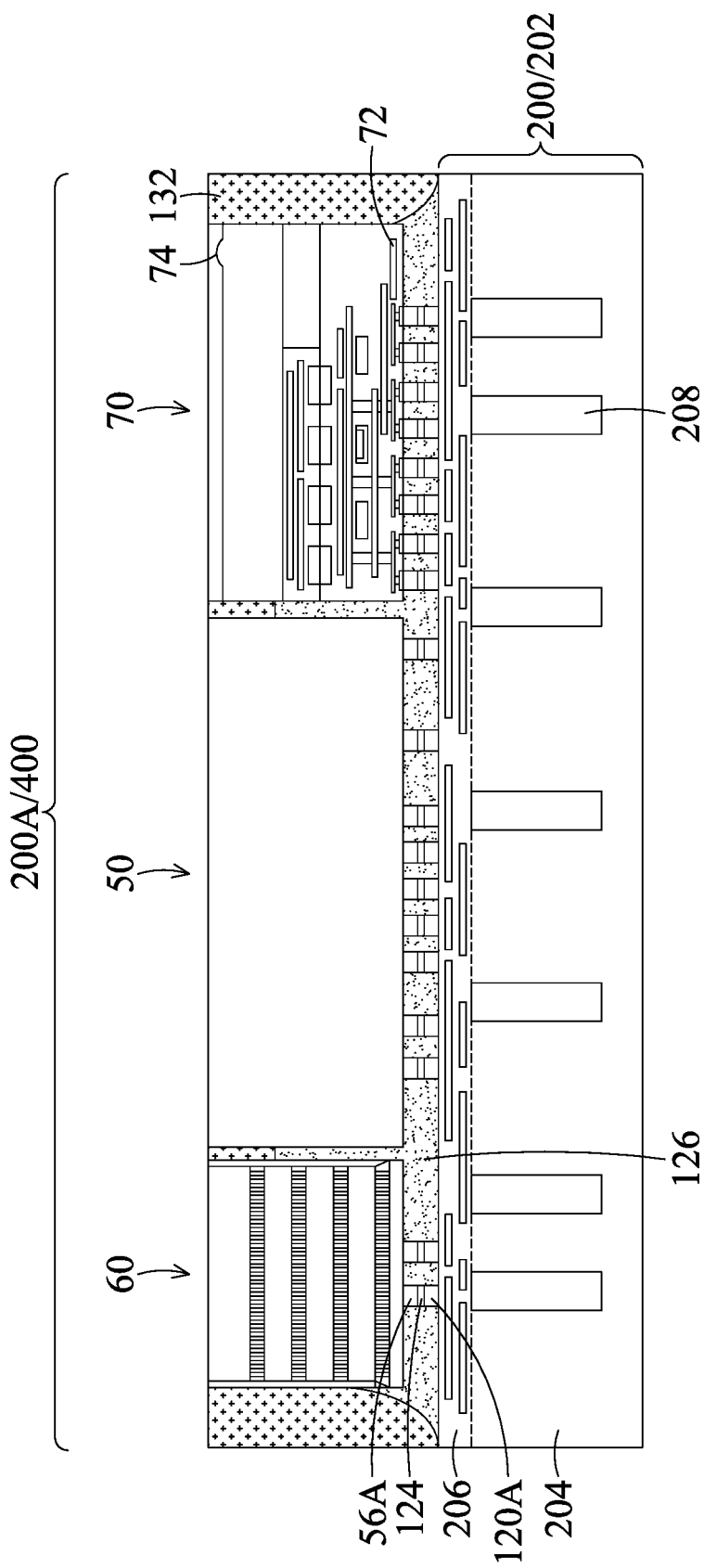
Figure 6:
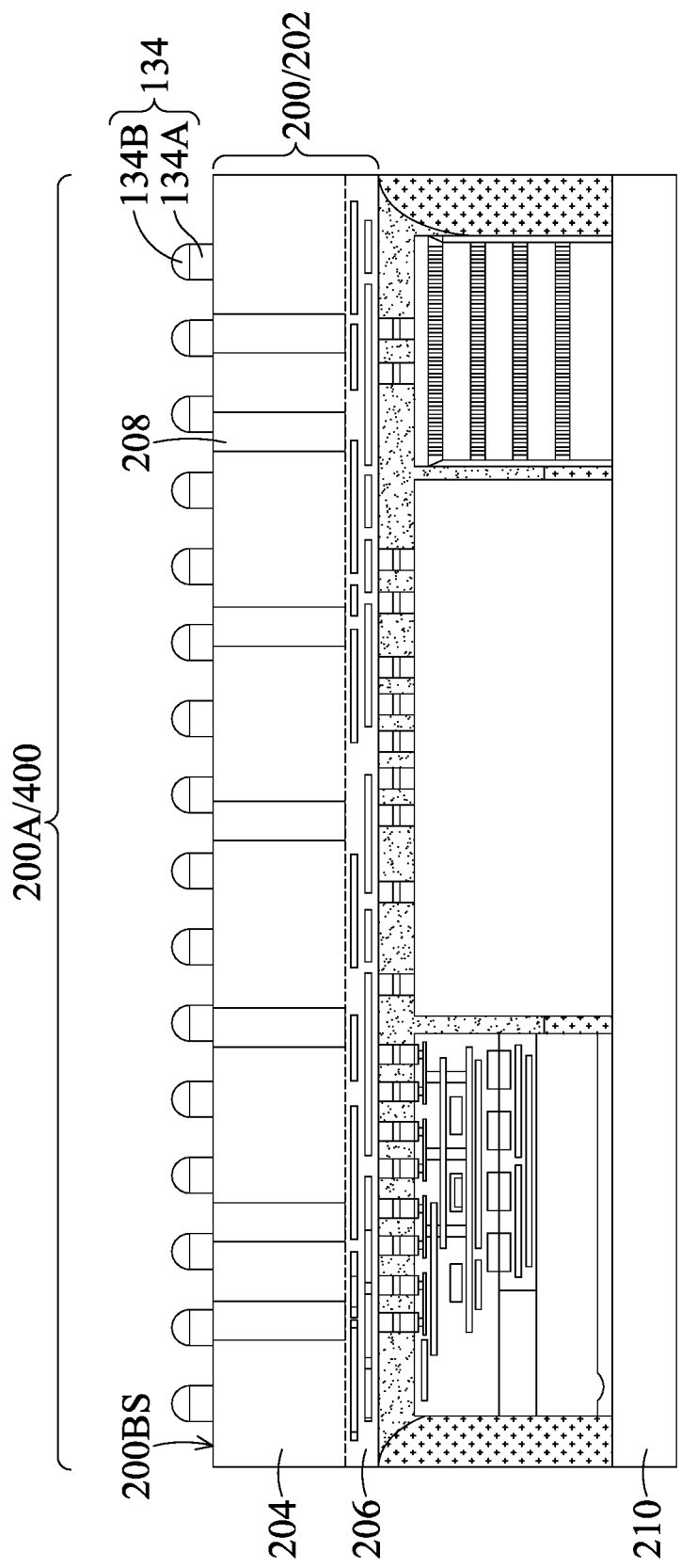

FIGS. 4-15 illustrate top and cross-sectional views of intermediate stages in the manufacturing of package components 600, in accordance with some embodiments. The package components 400 may be chip-on-wafer (CoW) package components. FIGS. 4-10A and 11-15 illustrate cross-sectional views, and FIG. 10B illustrates a plan view. In particular, FIGS. 4-6 illustrate formation of a wafer-level package component 200, in accordance with some embodiments. In some embodiments, the wafer-level package component 200 comprises a plurality of package regions (such as a region 200A) that correspond to package components (such as package components 400). The plurality of package regions of the wafer-level package component 200 are singulated to form individual packaged components 400 as described below in FIG. 7.

In FIG. 4, an interposer wafer 200 is obtained or formed. The interposer wafer 200 comprises a plurality of package regions, such as the package region 200A. The interposer wafer 200 comprises an interposer 202 in a package region (such as the package region 200A), which will be singulated in subsequent processing to be included in the package component 400. In some embodiments, the interposers 202 include a substrate 204, an interconnect structure 206, and conductive vias 208.

The substrate 204 may be formed using similar materials and methods as the semiconductor substrate 52 described above with reference to FIG. 1, and the description is not repeated herein. In some embodiments, the substrate 204 generally does not include active devices therein, although the interposers 202 may include passive devices formed in and/or on an active or a front surface (e.g., the surface facing upward in FIG. 4) of the substrate 204. In other embodiments, active devices such as transistors, capacitors, resistors, diodes, and the like, may be formed in and/or on the front surface of the substrate 204.

The interconnect structure 206 is formed over the front surface of the substrate 204, and is used to electrically connect the devices (if any) of the substrate 204. The interconnect structure 206 may include one or more dielectric layer(s) and respective metallization layer(s) in the dielectric layer(s). The interconnect structure 206 may be formed using similar materials and methods as the interconnect structure 54 described above with reference to FIG. 1, and the description is not repeated herein.

Further in FIG. 4, conductive connectors 120 are formed on the front-side 200FS of the interposer wafer 200 and in electrical contact with the interconnect structure 206. The conductive connectors 120 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 120 may include a conductive material such as solder, copper, aluminum, gold, nickel, silver, palladium, tin, the like, or a combination thereof. In some embodiments, the conductive connectors 120 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 120 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the conductive connectors 120 comprise UBMs 120A and solder regions 120B over the UBMs 120A. The UBMs 120A may be formed using similar materials and methods as the UBMs 56A described above with reference to FIG. 1, and the description is not repeated herein. The solder regions 120B may be formed using similar materials and methods as the solder regions 56B described above with reference to FIG. 1, and the description is not repeated herein.

The conductive vias 208 extend into the interconnect structure 206 and/or the substrate 204. The conductive vias 208 are electrically connected to metallization layer(s) of the interconnect structure 206. The conductive vias 208 are also sometimes referred to as through substrate vias (TSVs). As an example to form the conductive vias 208, recesses can be formed in the interconnect structure 206 and/or the substrate 204 by, for example, etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed of an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the interconnect structure 206 or the substrate 204 by, for example, a chemical mechanical polishing (CMP). Remaining portions of the barrier layer and conductive material form the conductive vias 208.

In FIG. 5, integrated circuit dies 50, 60 and 70 are attached to the interconnect structure 206. In the illustrated cross-sectional view, each package region (such as the region 200A illustrated in FIG. 5) of the wafer-level package component 200 comprises a single integrated circuit die 50, a single integrated circuit die 60, and a single integrated circuit die 70. The integrated circuit die 50 may be a logic device, such as an application-specific integrated circuit (ASIC) die, a central processing unit (CPU), a graphics processing unit (GPU), a system-on-a-chip (SoC), a microcontroller, or the integrated circuit die 50 may be a memory device, such as a dynamic random access memory (DRAM) die, a static random access memory (SRAM) die, or the like. In some embodiments, there may be multiple integrated circuit dies 50 and one may be a logic device and the other may be a memory device. In some embodiments, multiple integrated circuit dies 50 may be included and may be the same type of dies, such as SoC dies, ASIC dies, or the like. Although a single integrated circuit die 60 and a single integrated circuit die 70 are shown in the cross-sectional view in FIG. 5, there may be a plurality of integrated circuit dies 60 and a plurality of single integrated circuit dies 70 in each package region (such as the region 200A) of the wafer-level package component 200.

In some embodiments, the integrated circuit dies 50, 60 and 70 are attached to the interconnect structure 206 using the conductive connectors 56 (see FIGS. 1-3) and 120. The integrated circuit dies 50, 60 and 70 may be placed on the interconnect structure 206 using, e.g., a pick-and-place tool. After placing the integrated circuit dies 50, 60 and 70 on the interconnect structure 206, the solder regions 56B of the conductive connectors 56 (see FIGS. 1-3) are in physical contact with respective solder regions 120B of respective conductive connectors 120. After placing the integrated circuit dies 50, 60 and 70 on the interconnect structure 206, a reflow process in performed on the conductive connectors 56 and 120 (see FIGS. 1-4). The reflow process melts and merges the solder regions 56B and 120B into solder joints 124. The solder joints 124 electrically and mechanically couple the integrated circuit dies 50, 60 and 70 to the interconnect structure 206.

Further in FIG. 5, an underfill 126 may be formed around the solder joints 124, and in a gap between the interconnect structure 206 and the integrated circuit dies 50, 60 and 70. The underfill 126 may reduce stress and protect the solder joints 124. The underfill 126 may be formed of an underfill material such as a molding compound, epoxy, or the like. The underfill 126 may be formed by a capillary flow process after the integrated circuit dies 50, 60 and 70 are attached to the interconnect structure 206, or may be formed by a suitable deposition method before the integrated circuit dies 50, 60 and 70 are attached to the interconnect structure 206. The underfill 126 may be applied in liquid or semi-liquid form and then subsequently cured. In some embodiments, the underfill 126 partially or fully fills gaps between adjacent ones of the integrated circuit dies 50, 60 and 70, such that the underfill 126 extends along sidewalls of the integrated circuit dies 50, 60 and 70.

Further in FIG. 5, an encapsulant 132 is formed on and around the integrated circuit dies 50, 60, and 70. After formation, the encapsulant 132 encapsulates the integrated circuit dies 50, 60 and 70, and the underfill 126. The encapsulant 132 may be a molding compound, epoxy, or the like. The encapsulant 132 may not include fillers therein. The encapsulant 132 may be applied by compression molding, transfer molding, or the like, and is formed over the package component 200 such that the integrated circuit dies 50, 60 and 70 are buried or covered. The encapsulant 132 may be applied in liquid or semi-liquid form and then subsequently cured. The encapsulant 132 may be thinned to expose the integrated circuit dies 50, 60 and 70. The thinning process may be a grinding process, a CMP, an etch-back, combinations thereof, or the like. After the thinning process, top surfaces of the integrated circuit dies 50, 60 and 70, and the encapsulant 132 are coplanar (within process variations), such that they are level with one another. The thinning is performed until a desired amount of the integrated circuit dies 50, 60 and 70, and/or the encapsulant 132 has been removed.

In FIG. 6, the wafer-level package component of FIG. 5 is flipped over is attached to a carrier wafer 210. The carrier wafer 210 is used as a platform or a support for a packaging process described below. In some embodiments, the carrier wafer 210 comprises a semiconductor material (such as silicon, or the like), a dielectric material (such as glass, a ceramic material, quartz, or the like), a combination thereof, or the like. In some embodiments, the wafer-level package component is attached to the carrier wafer 210 using an adhesive (not shown).

The substrate 204 may be thinned to expose the conductive vias 208. Exposure of the conductive vias 208 may be accomplished by a thinning process, such as a grinding process, a CMP, an etch-back, combinations thereof, or the like. In some embodiments (not separately illustrated), the thinning process for exposing the conductive vias 208 includes a CMP, and the conductive vias 208 protrude at the back-side 200BS of the wafer 200 as a result of dishing that occurs during the CMP. In such embodiments, an insulating layer (not separately illustrated) may optionally be formed on the back surface of the substrate 204, surrounding the protruding portions of the conductive vias 208. The insulating layer may be formed of a silicon-containing insulator, such as, silicon nitride, silicon oxide, silicon oxynitride, or the like, and may be formed by a suitable deposition method such as spin coating, CVD, plasma-enhanced CVD (PECVD), high density plasma CVD (HDP-CVD), or the like. After the substrate 204 is thinned, the exposed surfaces of the conductive vias 208 and the insulating layer (if present) or the substrate 204 are coplanar (within process variations), such that they are level with one another, and are exposed at the back-side 200BS of the interposer wafer 200.

After the thinning process, if any, to expose the conductive vias 208, conductive connectors 134 are formed on the back-side 200BS of the interposer wafer 200. The conductive connectors 134 are electrically coupled to the conductive vias 208 and/or integrated circuit dies 50, 60, and 70. The conductive connectors 134 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 134 may be formed using similar materials and methods as the conductive connectors 120 described above with reference to FIG. 4, and the description is not repeated herein. In the illustrated embodiment, the conductive connectors 134 comprise UBMs 134A, and solder regions 134B over the UBMs 134A. The UBMs 134A and the solder regions 134B may be formed using similar material and methods as the UBMs 120A and the solder regions 120B, respectively, described above with reference to FIG. 4, and the description is not repeated herein.

Figure 7:
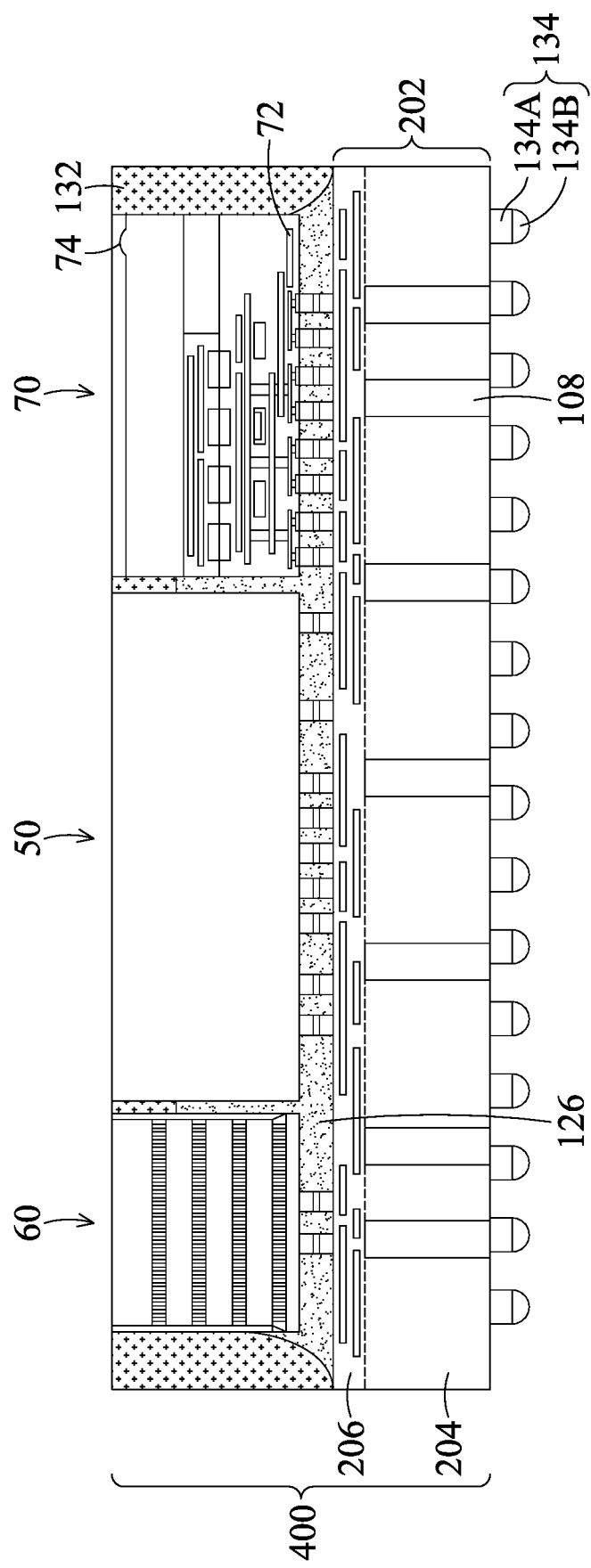

Further, a singulation process is performed by cutting along scribe line regions, e.g., around the package region 200A. The singulation process may include sawing, etching, dicing, a combination thereof, or the like. For example, the singulation process can include sawing the encapsulant 132, the interconnect structure 206, and the substrate 204. The singulation process singulates the package region 200A from adjacent package regions to form a singulated package component 400 as illustrated in FIG. 7. The singulated package component 400 is from the package region 200A. The singulation process forms interposers 202 from the singulated portions of the interposer wafer 200. As a result of the singulation process, the outer sidewalls of the interposer 202 and the encapsulant 132 are laterally coterminous (within process variations) as illustrated in FIG. 7.

Figure 12:
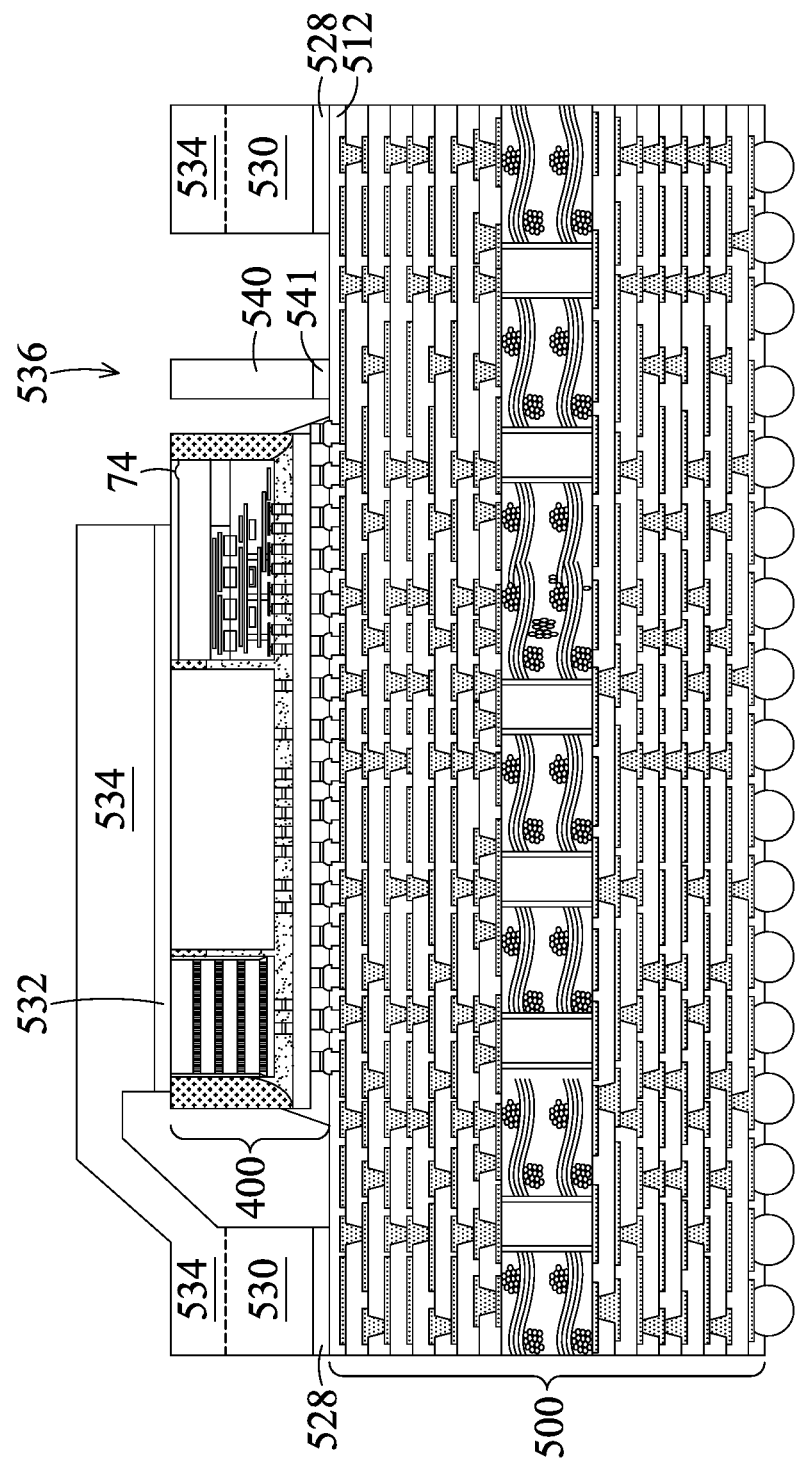
Figure 13:
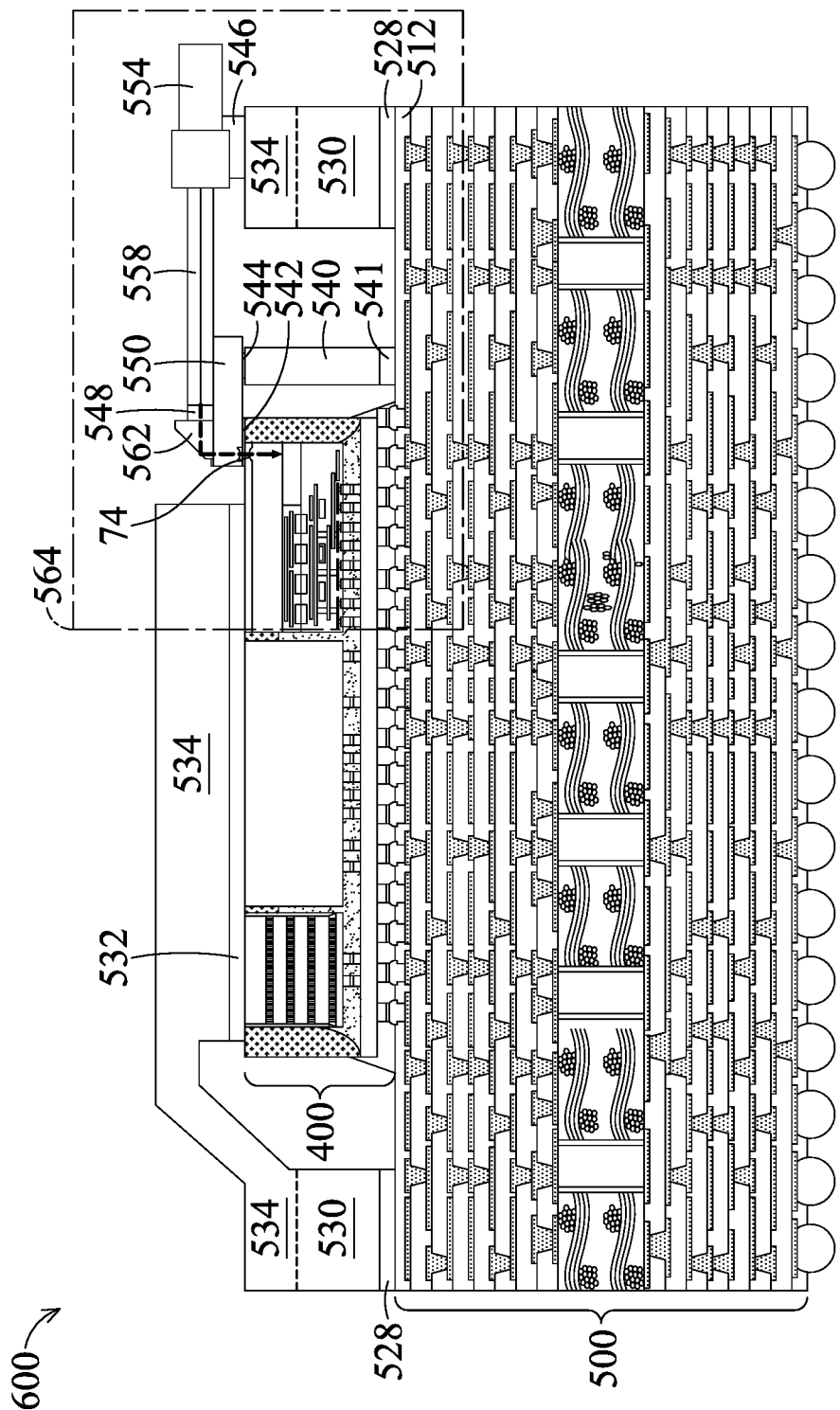
Figure 14:
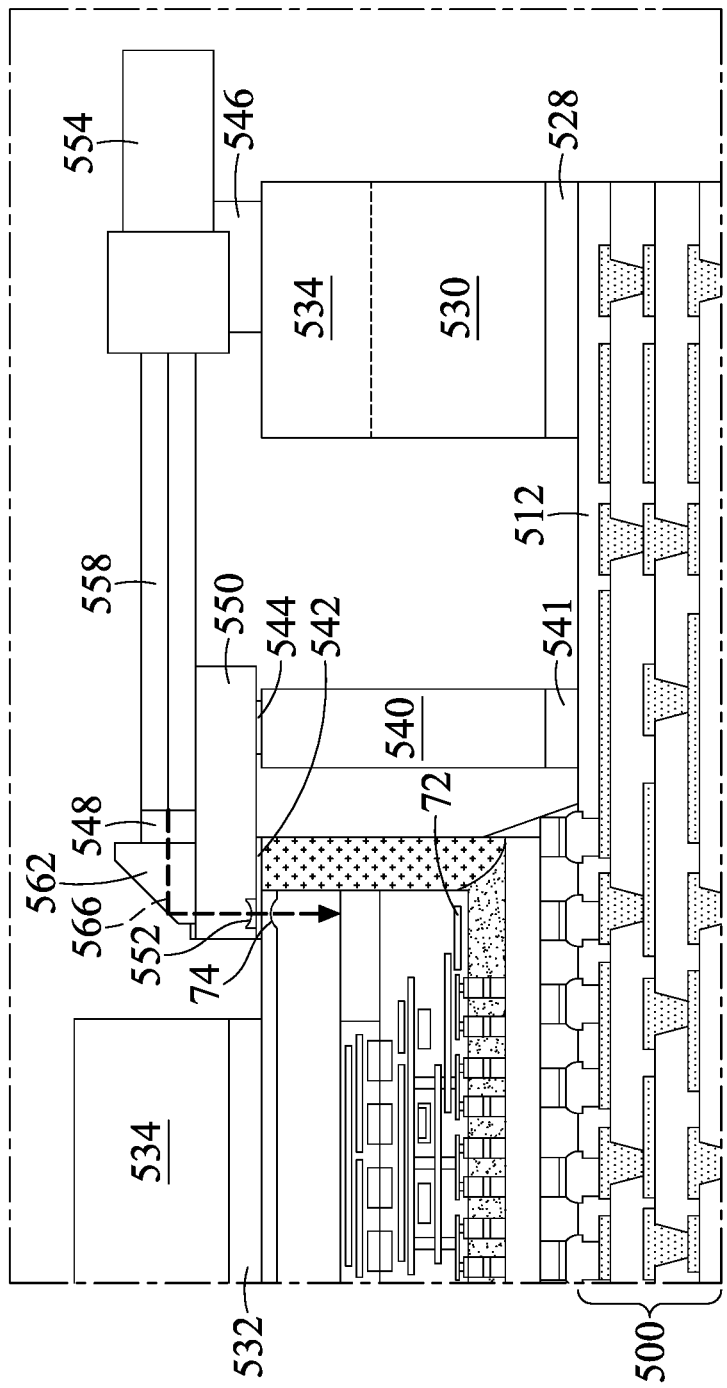
Figure 15:
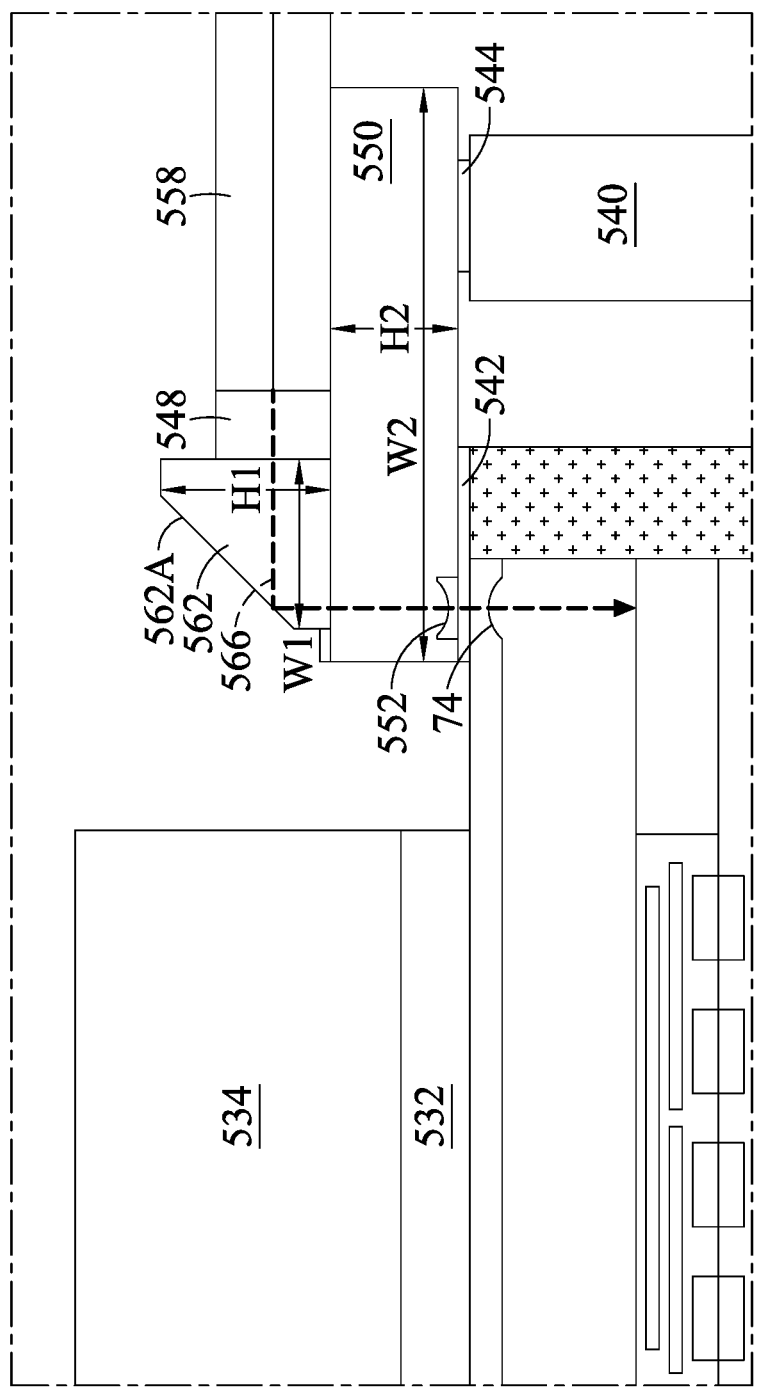

FIGS. 8-15 illustrate plan and cross-sectional views of intermediate stages in the manufacturing of a package 600, in accordance with some embodiments. In particular, FIGS. 8, 9, 10A, 11, 12, and 13 illustrate cross-sectional views, FIG. 10B illustrates a plan view, FIGS. 14 and 15 illustrate magnified views of a region 564 of FIG. 13.

Figure 8:
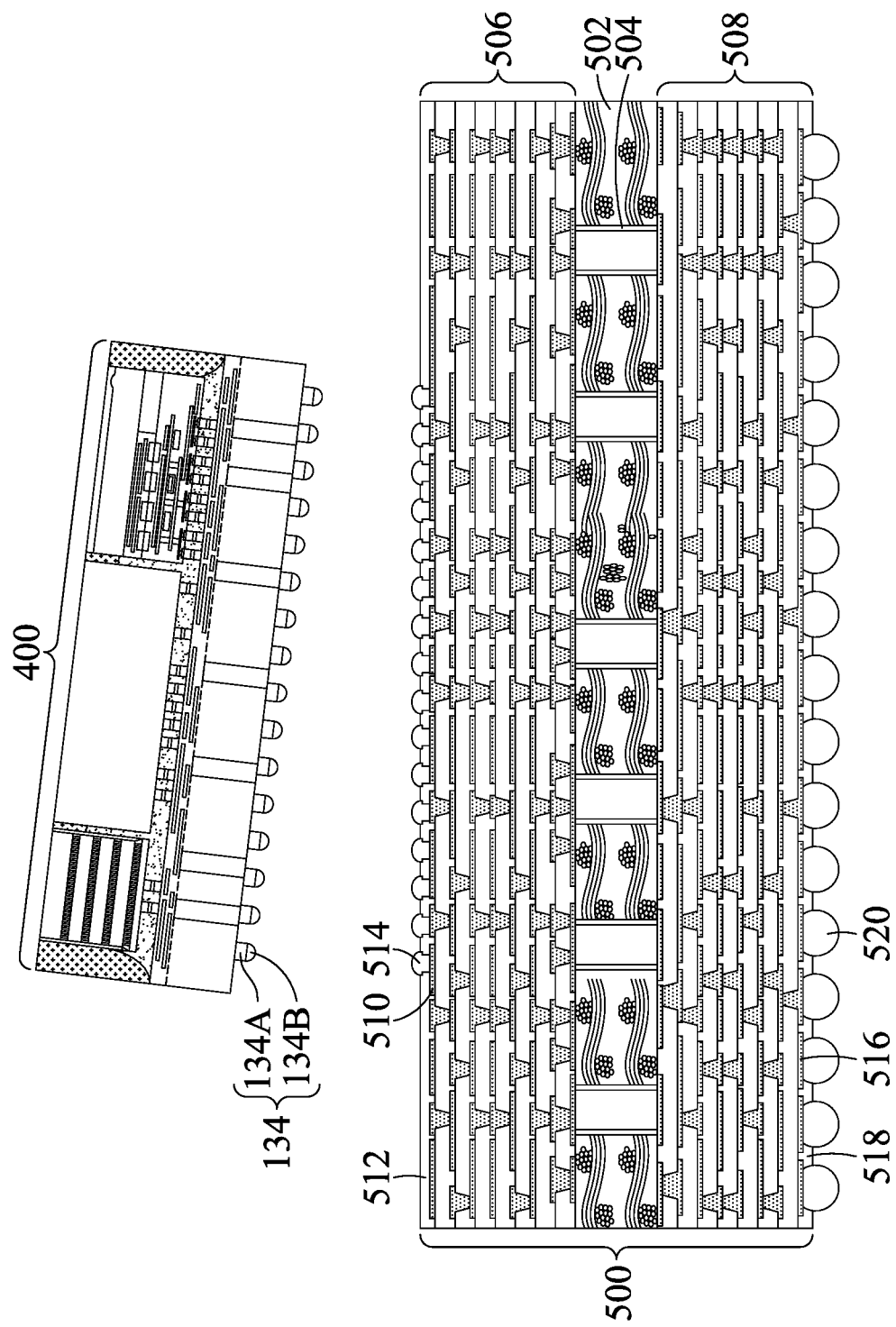

In FIG. 8, a package component 400 is placed on a package substrate 500. The package substrate 500 includes a substrate core 502, which may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations thereof, or the like, may also be used. Additionally, the substrate core 502 may be a SOI substrate. Generally, an SOI substrate includes a layer of a semiconductor material such as epitaxial silicon, germanium, silicon germanium, SOI, SGOI, or combinations thereof. In another embodiment, the substrate core 502 is an insulating core such as a fiberglass reinforced resin core. One example core material is fiberglass resin such as FR4. Alternatives for the core material include bismaleimide-triazine (BT) resin, or alternatively, other printed circuit board (PCB) materials or films.

In some embodiments, the substrate core 502 may include active and passive devices (not separately illustrated). Devices such as transistors, capacitors, resistors, combinations thereof, and the like may be used to generate the structural and functional requirements of the design for the system. The devices may be formed using any suitable methods. In some embodiments, the substrate core 502 is substantially free of active and passive devices. In some embodiments, the substrate core 502 further includes conductive vias 504, which may be also referred to as TSVs. In some embodiments, the conductive vias 504 may be formed using similar materials and methods as the conductive vias 208 described above with reference to FIG. 4, and the description is not repeated herein.

The package substrate 500 may also include a redistribution structure. In some embodiments, the redistribution structure may be formed of alternating layers of dielectric material (e.g., low-k dielectric material) and conductive material (e.g., copper) with vias interconnecting the layers of conductive material, and may be formed through any suitable process (such as deposition, damascene, or the like). In other embodiments, the redistribution structure may be formed of alternating layers of dielectric material (e.g., build up films such as Ajinomoto build-up film (ABF) or other laminates) and conductive material (e.g., copper) with vias interconnecting the layers of conductive material, and may be formed through any suitable process (such as lamination, plating, or the like).

In the illustrated embodiment, the package substrate 500 comprises redistribution structures 506 and 508 formed on opposing surfaces of the substrate core 502, such that the substrate core 502 is interposed between the redistribution structure 506 and the redistribution structure 508. The conductive vias 504 electrically couple the redistribution structure 506 to the redistribution structure 508. In some embodiments, the redistribution structure 506 or the redistribution structure 508 may be omitted.

In some embodiments, bond pads 510 and a solder resist layer 512 are formed on the redistribution structure 506, with the bond pads 510 being exposed by openings formed in the solder resist layer 512. The bond pads 510 may be a part of the redistribution structure 506 and may be formed together with other conductive features of the redistribution structure 506. The solder resist layer 512 may comprise a suitable insulating material (such as a dielectric material, a polymer material, or the like) and may be formed using any suitable deposition methods.

In some embodiments, conductive connectors 514 extend through the opening in the solder resist layer 512 and contact the bond pads 510. The conductive connectors 514 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 514 may be formed using similar materials and methods as the conductive connectors 120 described above with reference to FIG. 4, and the description is not repeated herein. In the illustrated embodiment, the conductive connectors 514 comprise solder balls.

In some embodiments, bond pads 516 and a solder resist layer 518 are formed on the redistribution structure 508, with the bond pads 516 being exposed by openings formed in the solder resist layer 518. The bond pads 516 may be a part of the redistribution structure 508 and may be formed together with other conductive features of the redistribution structure 508. The solder resist layer 518 may comprise a suitable insulating material (such as a dielectric material, a polymer material, or the like) and may be formed using any suitable deposition methods.

In some embodiments, conductive connectors 520 extend through the openings in the solder resist layer 518 and contact the bond pads 516. The conductive connectors 520 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 520 may be formed using similar materials and methods as the conductive connectors 120 described above with reference to FIG. 4, and the description is not repeated herein. In the illustrated embodiment, the conductive connectors 520 comprise solder balls.

In some embodiments, the package component 400 may be placed on the package substrate 500 using, e.g., a pick-and-place tool. After placing the package component 400 on the package substrate 500, the conductive connectors 134 are in physical contact with respective conductive connectors 514, such that the solder regions 134B of the conductive connectors 134 are in physical contact with the respective conductive connectors 514.

Figure 9:
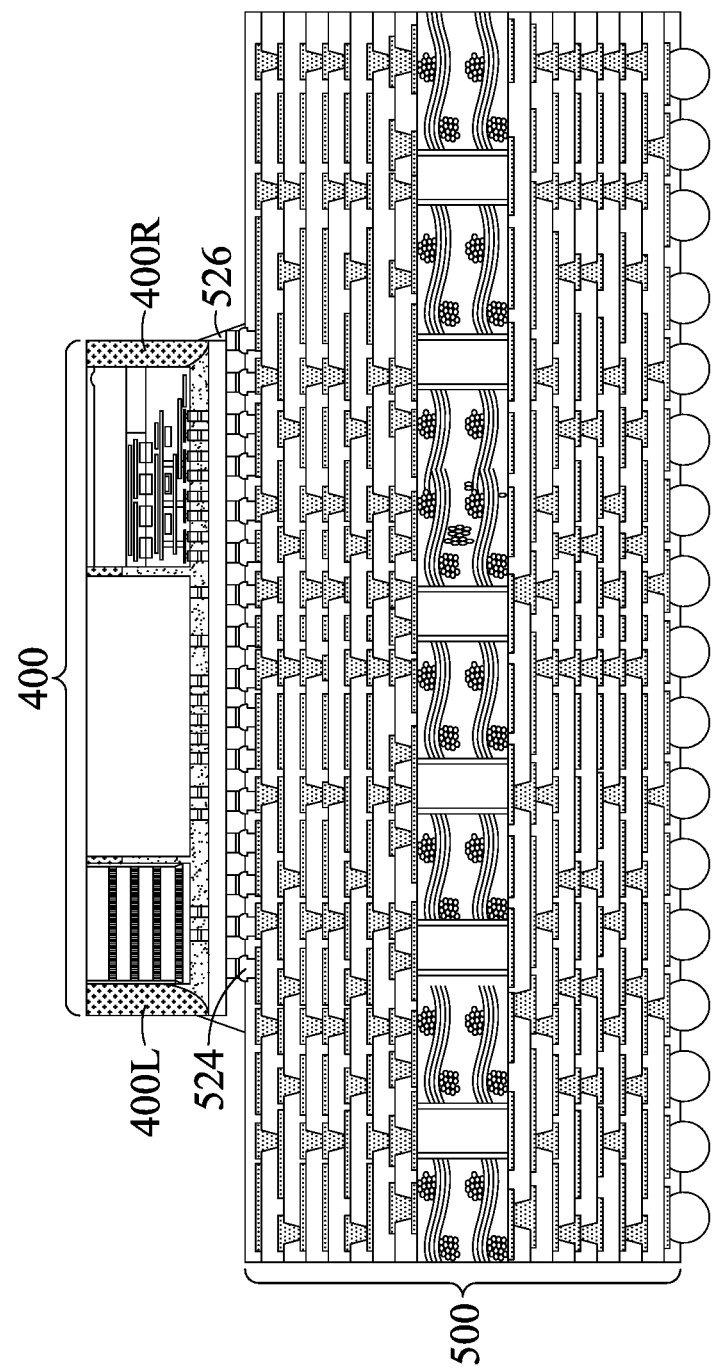

In FIG. 9, after placing the package component 400 on the package substrate 500, a reflow process is performed to mechanically and electrically attach the package component 400 to the package substrate 500. The reflow process melts and merges the solder regions 134B of the conductive connectors 134 (see FIG. 8) and respective solder materials of the conductive connectors 514 (see FIG. 8) into solder joints 524. The solder joints 524 electrically and mechanically couple the package component 400 to the package substrate 500.

In some embodiments, an underfill 526 may be formed around the solder joints 524, and in a gap between the package component 400 and the package substrate 500. The underfill 526 may be formed using similar materials and methods as the underfill 126 described above with reference to FIG. 5, and the description is not repeated herein. In some embodiments, the underfill 526 extends along and physically contacts a sidewall 400L of the package component 400, with the sidewall 400L being opposite to the sidewall 400R.

Figure 10A:
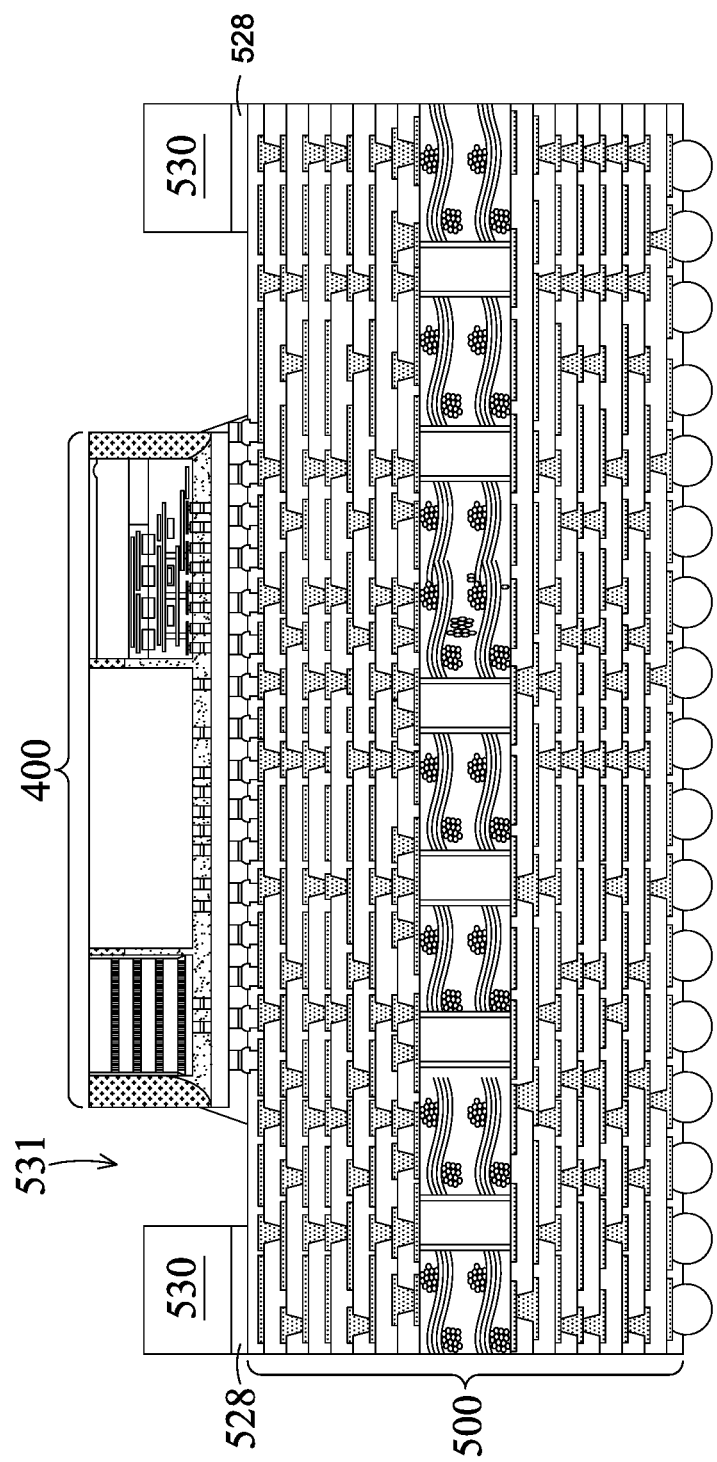
Figure 10B:
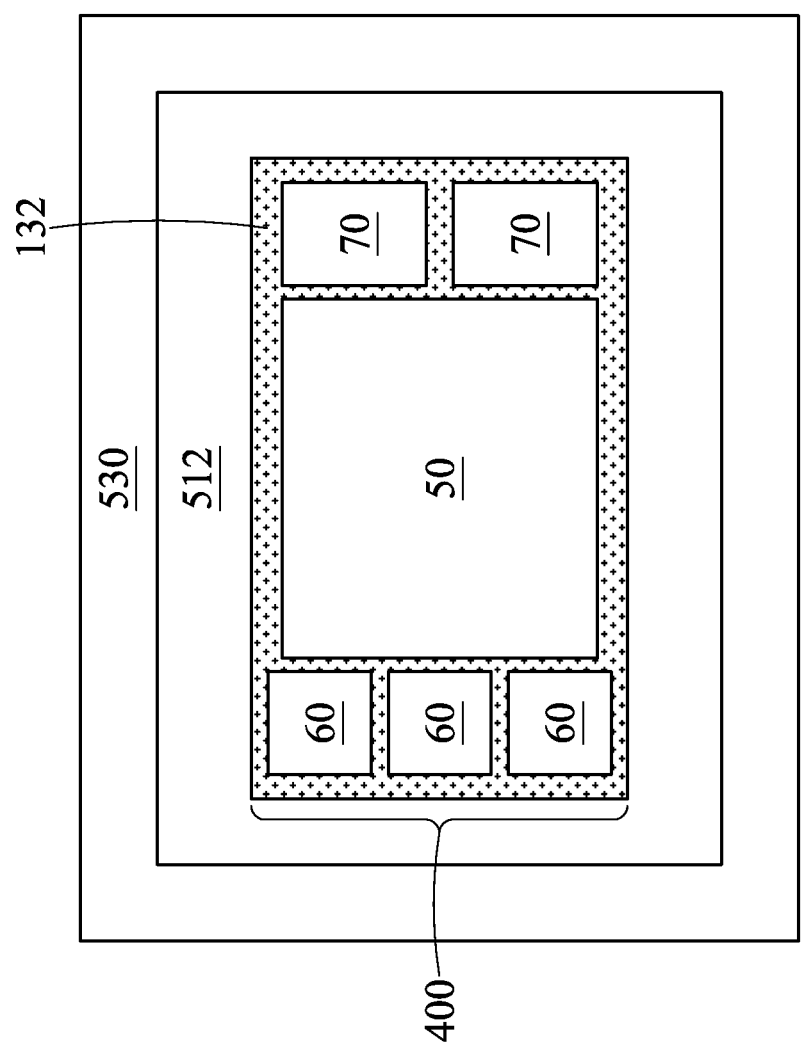

FIGS. 10A and 10B illustrate a cross-sectional and a plan view after a warpage control structure 530 is attached to the package substrate 500. The warpage control structure 530 may be attached to the package substrate 500 by an adhesive 528, such that the adhesive 528 is interposed between the warpage control structure 530 and the solder resist layer 512. The adhesive 528 may be any suitable adhesive, epoxy, or the like. The warpage control structure 530 may be an annular structure (see FIG. 10B) and may comprise a hole 531. The package component 400 may be disposed in the hole 531 of the warpage control structure 530. The warpage control structure 530 may comprise a metal, a metal alloy, a dielectric material, a semiconductor material, or the like.

Figure 11:
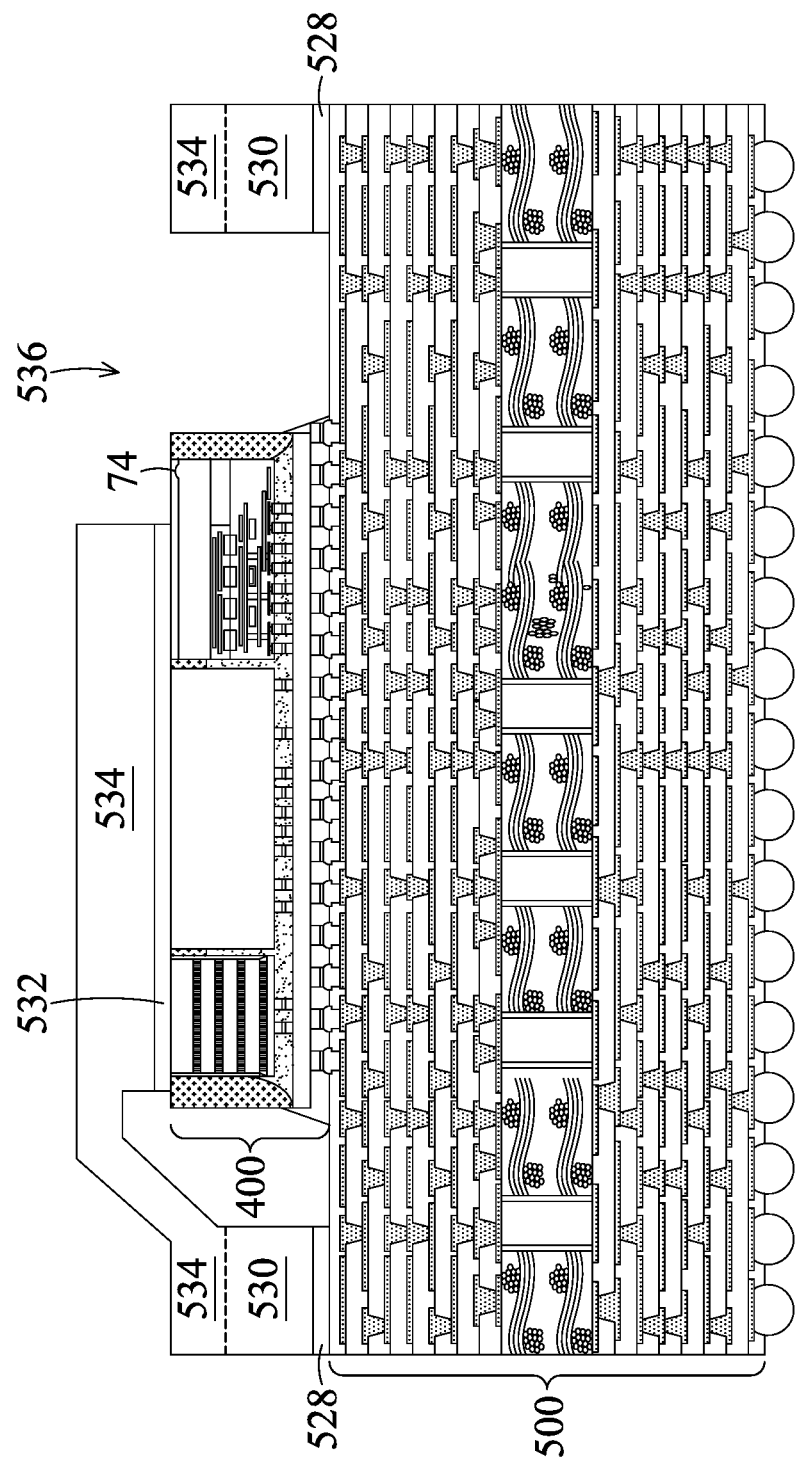

In FIG. 11, a heat dissipation lid 534 is attached to the warpage control structure 530. In some embodiments, the heat dissipation lid 534 comprises a high thermal conductivity material, such as a metal, a metal alloy, or the like. The heat dissipation lid 534 may be attached to the lid by an adhesive, a thermal interface material, or other means of attaching the two structures. In some embodiments, the heat dissipation lid 534 and the warpage control structure 530 are an integral structure and are placed on the package substrate 500 and the package component 400 at the same time. In some embodiment, a thermal interface material 532 is interposed between the top surface of the package component 400 and the heat dissipation lid 534. The thermal interface material 532 may comprise a thermal interface material having a high thermal conductivity. In some embodiments, the heat dissipation lid 534 comprises an opening 536 that exposed the lens 74 of the optical engine 70. This allows for a subsequently formed optical path to have access to the optical engine 70.

FIG. 12 illustrates a support structure 540 being attached to the solder resist layer 512 of the package substrate 500 in the opening 536 of the heat dissipation lid 534 using an adhesive 541. The support structure 540 may comprise a semiconductor material (such as, for example, silicon), a dielectric material, a combination thereof, or the like. The adhesive 541 may be formed using similar materials and methods as the adhesive 528.

In FIGS. 13, 14, and 15 illustrate further processing with FIGS. 14 and 15 illustrating magnified views of a region 564 of FIG. 13. A lens adapter 550 is attached to the package component 400 and the support structure 540. The lens adapter 550 provides an interface between the lens 74 of the integrated circuit die 70 and an optical fiber 558 and a mirror 562 that are attached to the lens adapter 550. The lens adapter 550 may be attached to a top surface of the package component 400 using optical glue 542, such that the optical glue 542 is in physical contact with the top surface of the integrated circuit die 70 and the top surface of the encapsulant 132. The lens adapter 550 may be attached to a top surface of the support structure 540 using an optical glue 544. In some embodiments, the optical glue 542 and 544 comprises a polymer material such as epoxy-acrylate oligomers. The polymer material may have a refractive index between about 1 and about 3. In some embodiments, the optical glue 544 may be replaced with an adhesive similar to adhesive 528 described above.

The lens adapter 550 includes a lens 552 which is over and aligned with the lens 74 of the integrated circuit die 70. In some embodiments, the lens adapter 550 comprises glass, silicon, the like, or a combination thereof. The mirror 562 is over and attached to the lens adapter 550 with an optical glue 548 and the optical fiber 558 is attached to the lens adapter and the mirror 562 with the optical glue 548. In some embodiments, the mirror 562 comprises glass, silicon, quartz, acrylic, plastic, the like, or a combination thereof. The mirror 562 allows for a more compact package as it enables a laterally extending optical fiber 558 to utilize the top surface entry of the optical engine 70. Further, the lens adapter 550 and the support structure 540 enable this compact structure by supporting the optical fiber and the mirror 562. The optical fiber 558 extends from a mechanical transfer structure 554. The mechanical transfer structure 554 is attached to the heat dissipation lid 534 by an optical glue 546. In some embodiments, the optical glue 546 may be replaced with an adhesive similar to adhesive 528 described above.

An optical data path 566 is formed from the optical fiber 558 to the optical coupler 72 of the integrated circuit die 70 by way of the optical glue 548, the mirror 562, the lens adapter 550, the lens 552, the optical glue 542, and the lens 74. The lens 552 of the lens adapter and the lens 74 of the optical engine 70 may each have a dimension in a range from 50 µm to 500 µm with a curvature in a range from 10 µm to 300 µm. The lens 552 may be formed of a dielectric or a semiconductor material, such as silicon, glass, quartz, the like, or a combination thereof.

By having the lens adapter 550, the support structure 540, and the mirror 562, the package structure can be more compact and still utilize a lateral entry optical fiber 558 and top surface entry to the optical engine 70 for the optical data path 566 from the optical fiber 558.

As shown in FIG. 15, the mirror 562 has a height H1, a width W1, and a length (not shown) extending into and out of the cross-sectional view of FIG. 15. In some embodiments, the length is in a range from 2 mm to 20 mm, the height H1 is in a range from 0.3 mm to 5 mm, and the width W1 is in a range from 0.3 mm to 5 mm. The mirror 562 has a reflective surface 562A that forms a first angle with the incoming optical data path 566 from the optical fiber 558. In some embodiments, the first angle is substantially 45 degrees (within process variations).

Further as shown in FIG. 15, the lens adapter has a height H2, a width W2, and a length (not shown) extending into and out of the cross-sectional view of FIG. 15. In some embodiments, the length is in a range from 2 mm to 30 mm, the height H2 is in a range from 0.3 mm to 2 mm, and the width W2 is in a range from 0.5 mm to 50 mm.

Figure 16B:
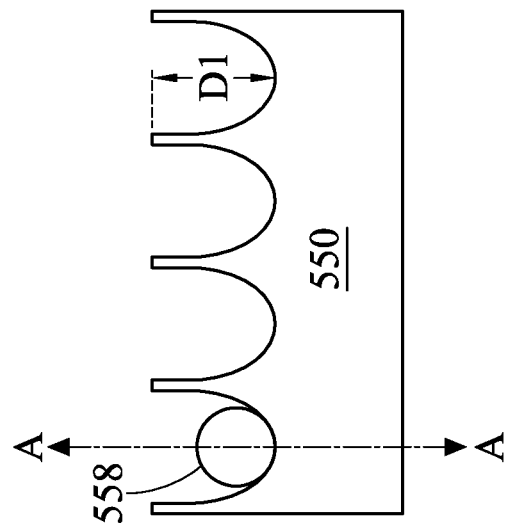
FIGS. 16A, 16B, 17A, 17B, 17C, 17D, 17E, 17F, 17G, 17H, 18A, 18B, and 18C illustrate magnified cross-sectional views of a package component, in accordance with some embodiments.
Figure 16A:
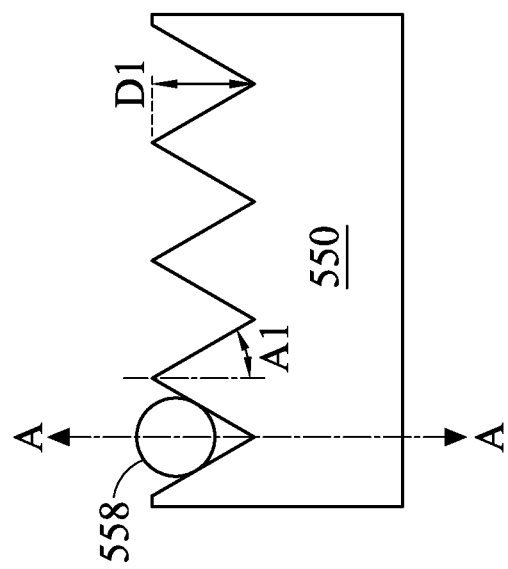

FIGS. 16A-B illustrate cross-sectional views of the lens adapter 550 and the optical fiber 558 in accordance with some embodiments. The cross-sectional views in FIGS. 16A-B are along the direction of the length such that the cross-sectional view in FIG. 15 is taken along the A-A lines in FIGS. 16A-B. FIGS. 16A-B illustrate embodiments with the lens adapter 550 having a grooved top surface with the optical fiber 558 being in one of the groves. In some embodiments, there are multiple optical fibers 558 on a single lens adapter with each optical fiber 558 being in a separate groove of the lens adapter 550. In these embodiments, the optical fibers 558 can be connected to one or more optical engines 70 of the package structure.

In FIG. 16A, the grooves are V-shaped with the grooves have a depth D1 and the faces of the grooves forming an angle A1 with a vertical line. In some embodiments, the depth D1 is in a range from 50 μm to 250 μm, and the angle A1 is substantially 45 degrees (within process variations). In FIG. 16B, the grooves are U-shaped with the grooves having the depth D1.

Figure 17A:
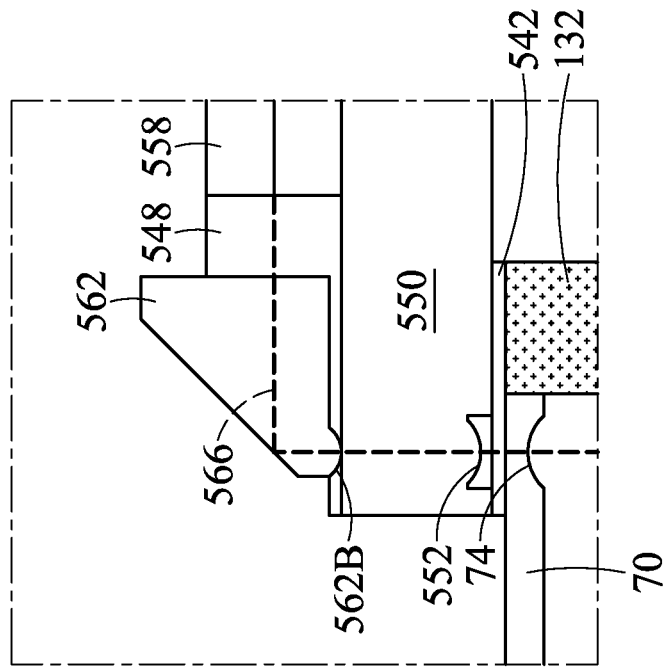
Figure 17B:
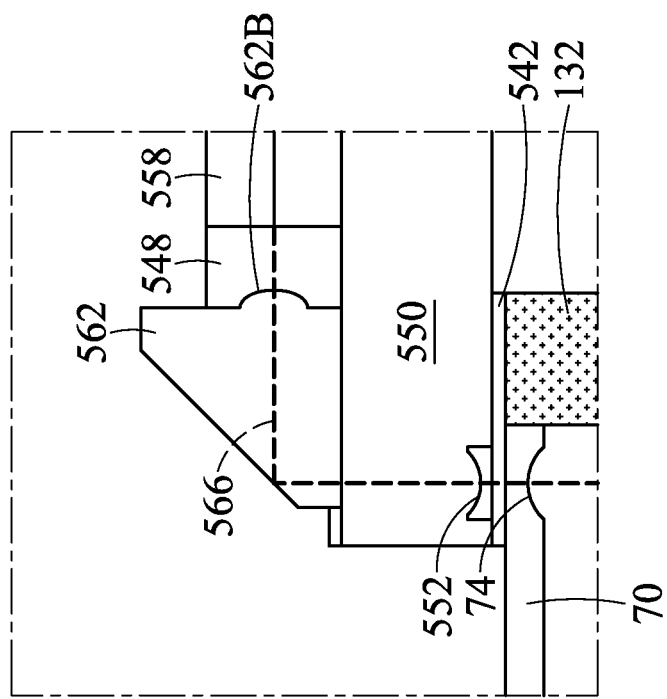
Figure 17D:
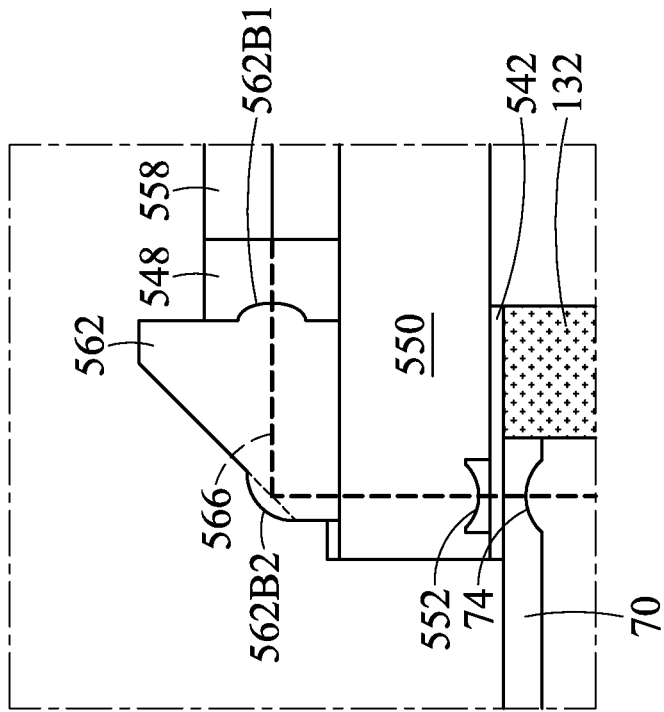
Figure 17C:
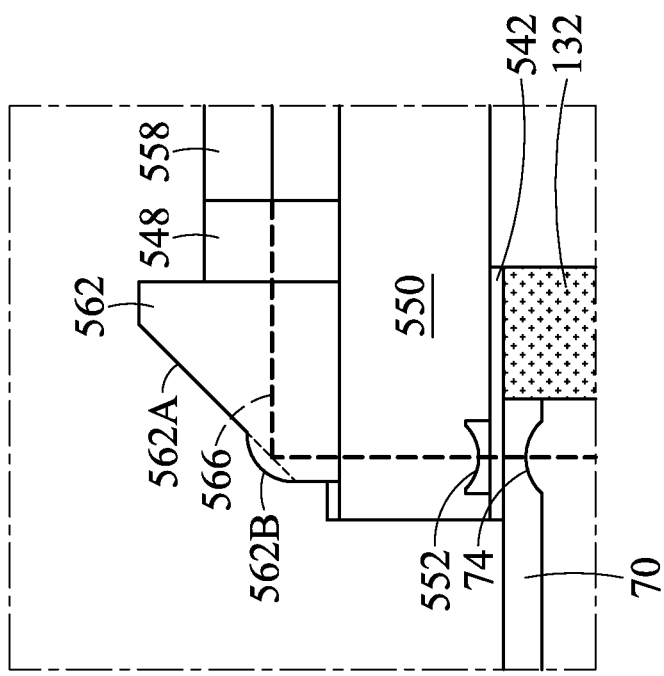
Figure 17E:
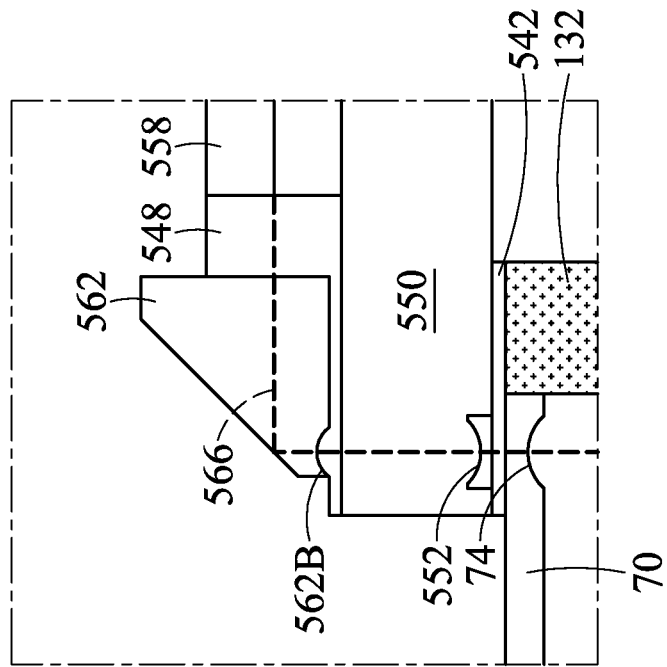
Figure 17F:
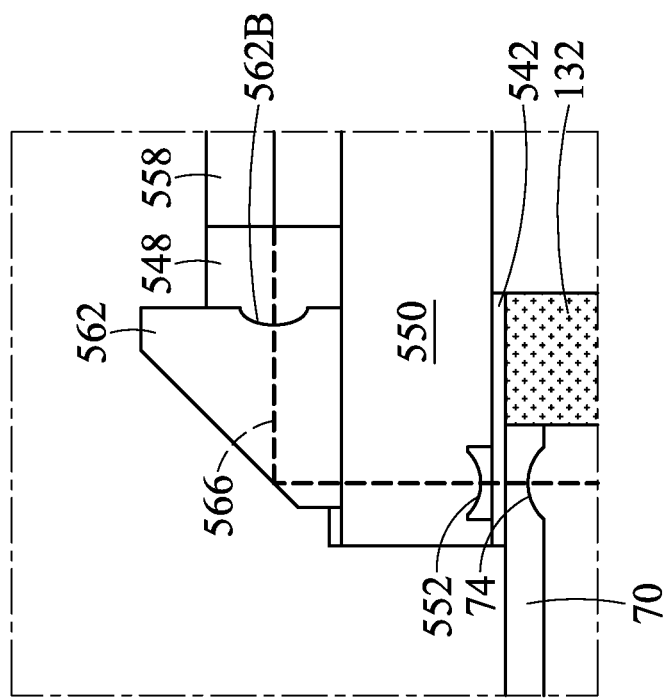
Figure 17H:
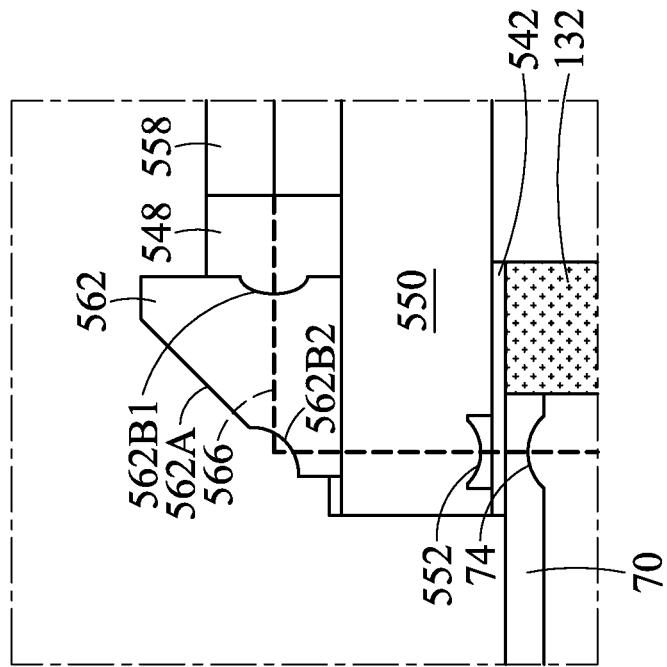
Figure 17G:
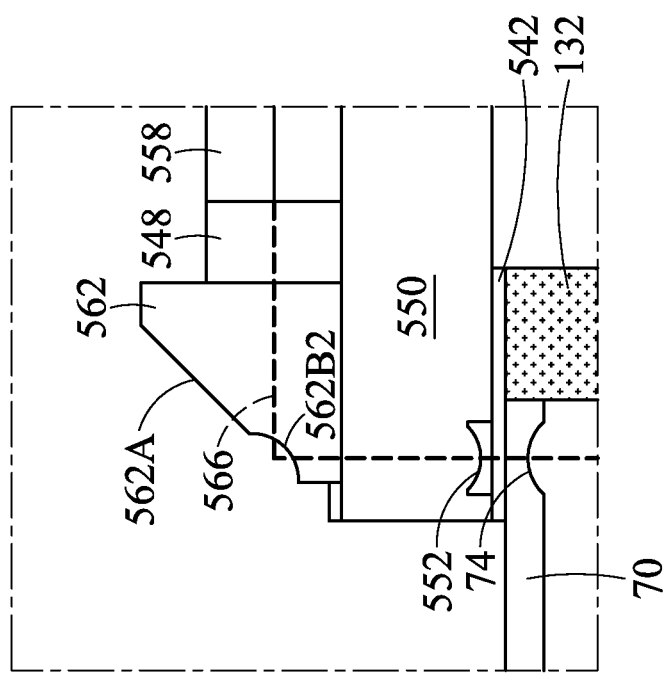

FIGS. 17A-H illustrated magnified cross-sectional views of the mirror 562 and surrounding components in accordance with some embodiments. Although the prior embodiments have illustrated the mirror 562 as not including any lenses, in some embodiment the mirror 562 can include one or more lens. In FIG. 17A, the mirror 562 includes a convex lens 562B facing the optical fiber 558. In FIG. 17B, the mirror 562 includes a convex lens 562B facing the optical engine 70. In FIG. 17C, the reflective surface 562A of the mirror 562 includes a convex lens 562B. In FIG. 17D, the mirror 562 includes two lenses: a convex lens 562B1 facing the optical fiber 558 and the reflective surface 562A of the mirror 562 includes a convex lens 562B2. In FIG. 17E, the mirror 562 includes a concave lens 562B facing the optical fiber 558. In FIG. 17F, the mirror 562 includes a concave lens 562B facing the optical engine 70. In FIG. 17G, the reflective surface 562A of the mirror 562 includes a concave lens 562B. In FIG. 17H, the mirror 562 includes two lenses: a concave lens 562B1 facing the optical fiber 558 and the reflective surface 562A of the mirror 562 includes a concave lens 562B2.

In each of the embodiments of FIGS. 17A-H, the lens 562B have a dimension in a range from 50 μm to 500 μm with a curvature in a range from 10 μm to 300 μm. Other embodiments may include alterations of the embodiments of FIGS. 17A-H including multiple concave lenses, combinations of convex and concave lenses, and various other combinations of the embodiments.

The embodiments of the lenses in FIGS. 17A-H show that the design of the lens is flexible, and a combination concave or convex lens design may be utilized based on design requirements. In an embodiment, a combination of any of the lens illustrated in FIGS. 17A-H may be applied based on different alignment requirements. Concave and convex mirror lens have different light guiding properties, and these types of mirror lens can be arranged at any position based on alignment requirements of the design.

Figure 18A:
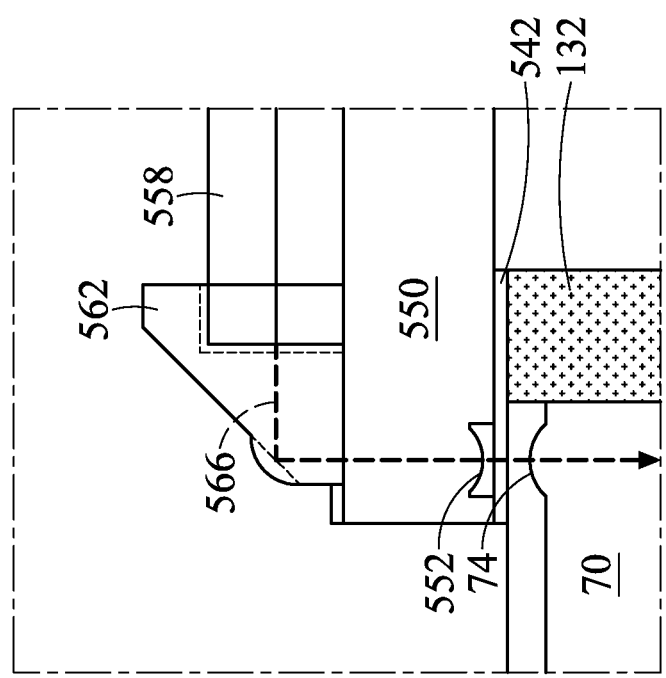
Figure 18C:
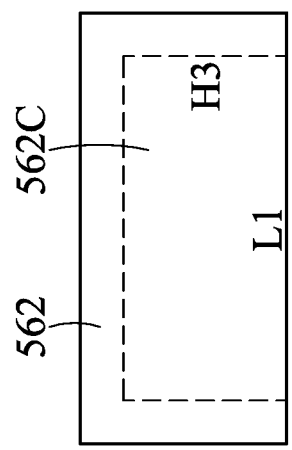
Figure 18B:
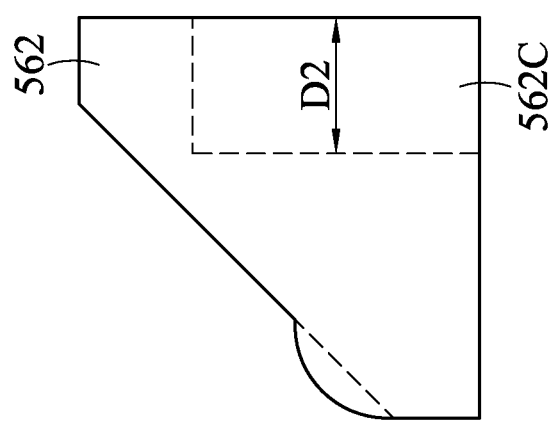

FIGS. 18A-C illustrated magnified cross-sectional views of the mirror 562, the optical fiber 558, and surrounding components in accordance with some embodiments. FIG. 18C is a cross-sectional view of the mirror 562 along the length of the mirror 562. In the embodiment of FIGS. 18A-C, the mirror 562 has a recess 562C such that the optical fiber 558 is inserted into the mirror 562. In this embodiment, the optical glue between the mirror 562 and the optical fiber 558 can be omitted as the insertion can hold the components together.

As shown in FIGS. 18B and 18C, the recess 562C of the mirror 562 has a height H3, a length L1, and a depth D2. In some embodiments, the length L1 is in a range from 2 mm to 20 mm, the height H3 is in a range from 0.08 mm to 2 mm, and the depth D1 is in a range from 0.08 mm to 2 mm.

The embodiments of FIGS. 16A-18C can be utilized in any of the package structures in the disclosure.

Figure 19:
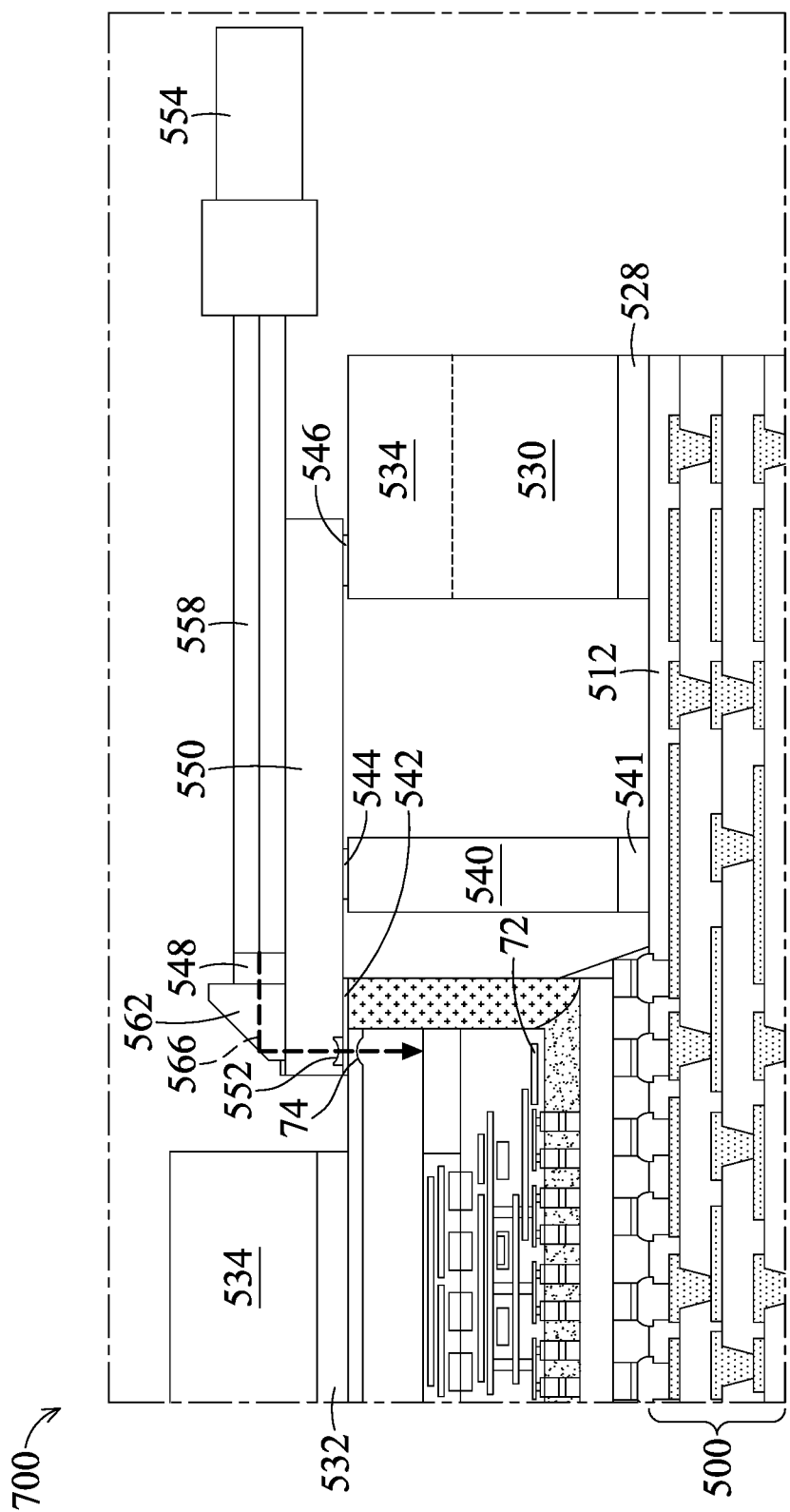
FIG. 19 illustrates a cross-sectional view of a package component, in accordance with some embodiments.

FIG. 19 illustrates a magnified view of a cross-sectional view of a package component 700, in accordance with some embodiments. The package component 700 is similar to the package component 600 (see FIGS. 13 and 14), with similar features being labeled by similar numerical references, and descriptions of the similar features are not repeated herein. In some embodiments, the package component 700 may be formed using process steps that are similar to the process steps described above with reference to FIGS. 1-14, and the description is not repeated herein. In the illustrated embodiment, the lens adapter 550 extends from the optical engine 70 to the heat dissipation lid 534/warpage control structure 530.

Figure 20:
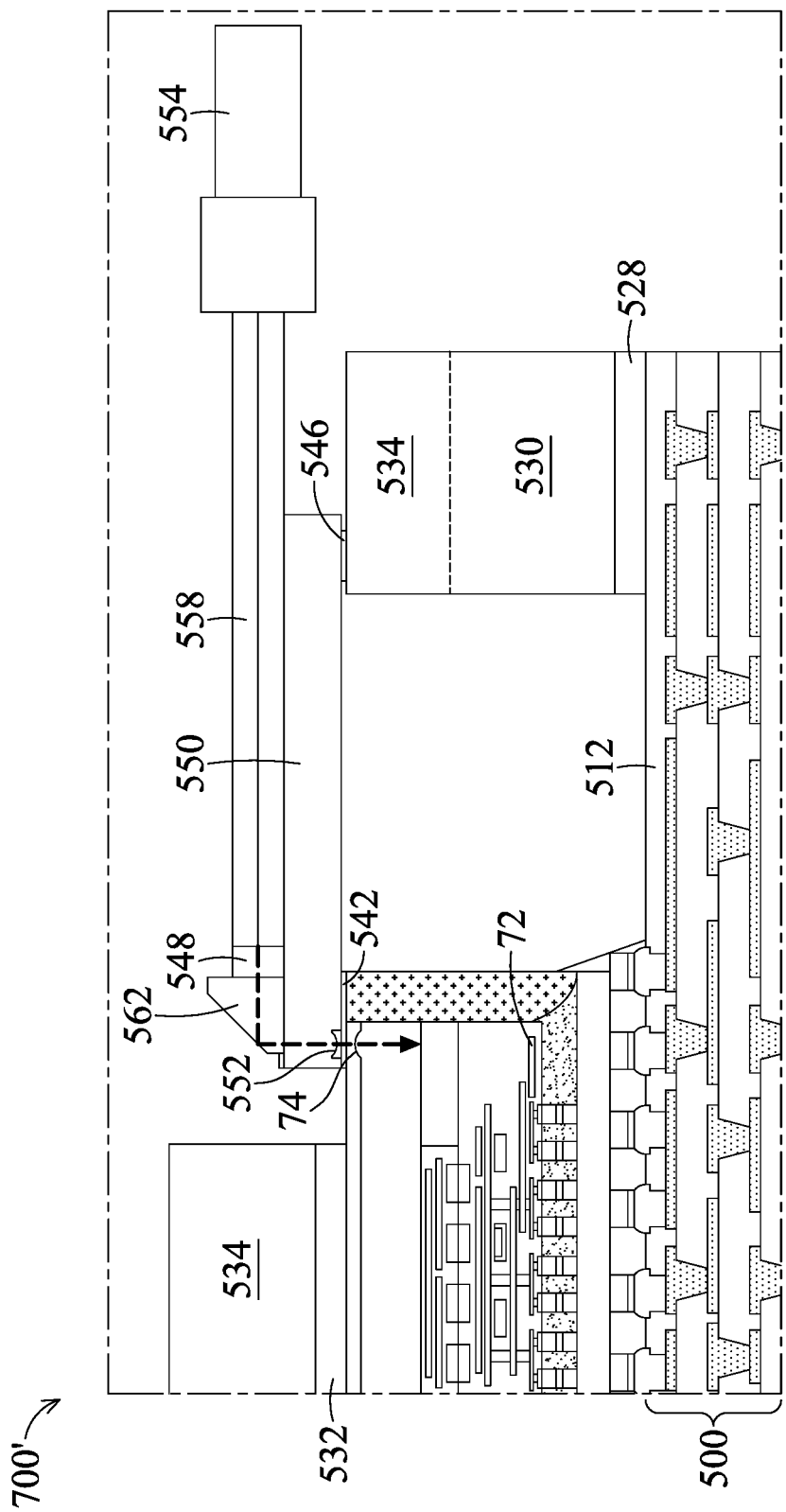
FIG. 20 illustrates a cross-sectional view of a package component, in accordance with some embodiments.

FIG. 20 illustrates a magnified view of a cross-sectional view of a package component 700, in accordance with some embodiments. The package component 700' is similar to the package component 700 (see FIG. 19), with similar features being labeled by similar numerical references, and descriptions of the similar features are not repeated herein. In the illustrated embodiment, the lens adapter 550 extends from the optical engine 70 to the heat dissipation lid 534/warpage control structure 530 and the support structure 540 is omitted.

Figure 21:
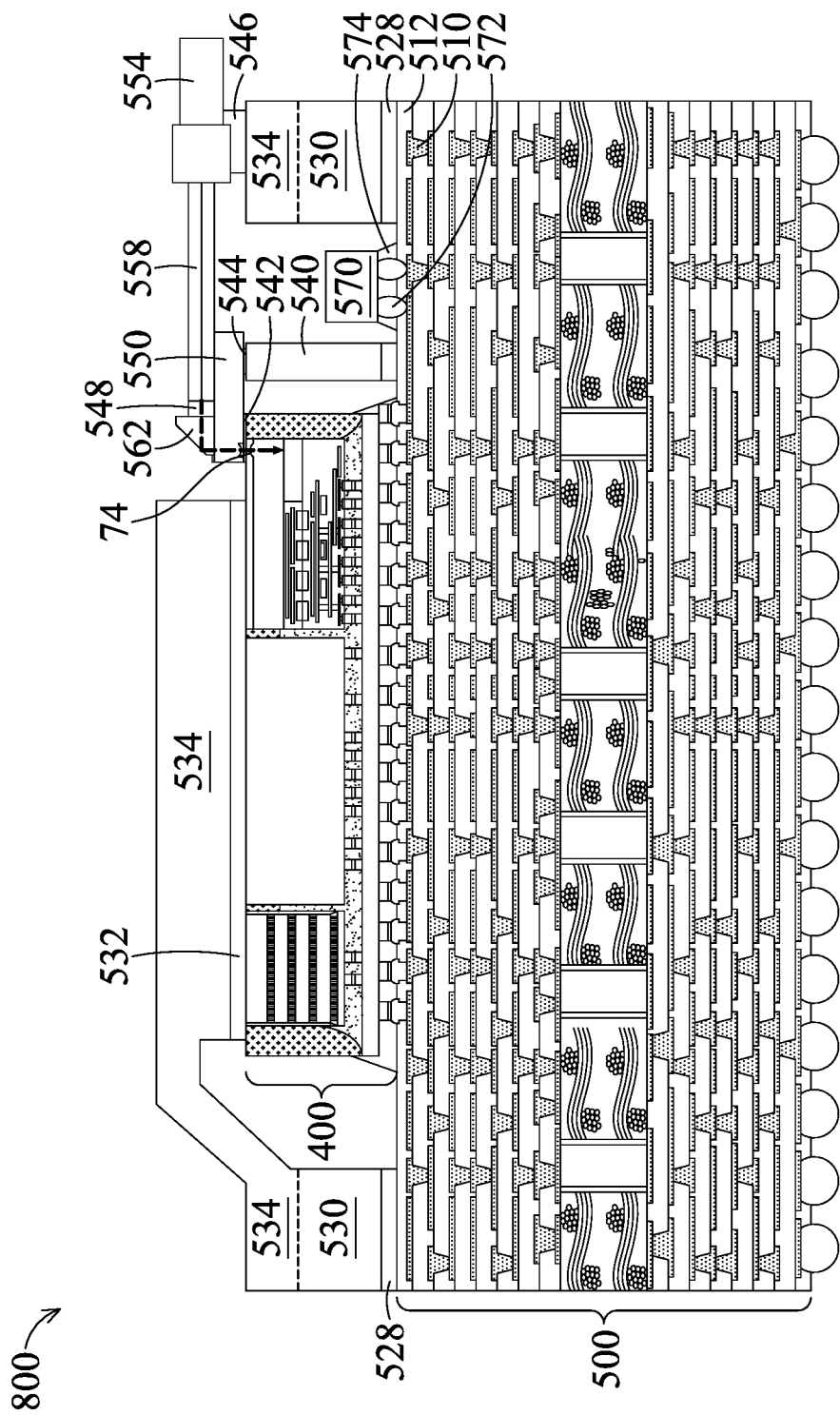
FIG. 21 illustrates a cross-sectional view of a package component, in accordance with some embodiments.
Figure 22:
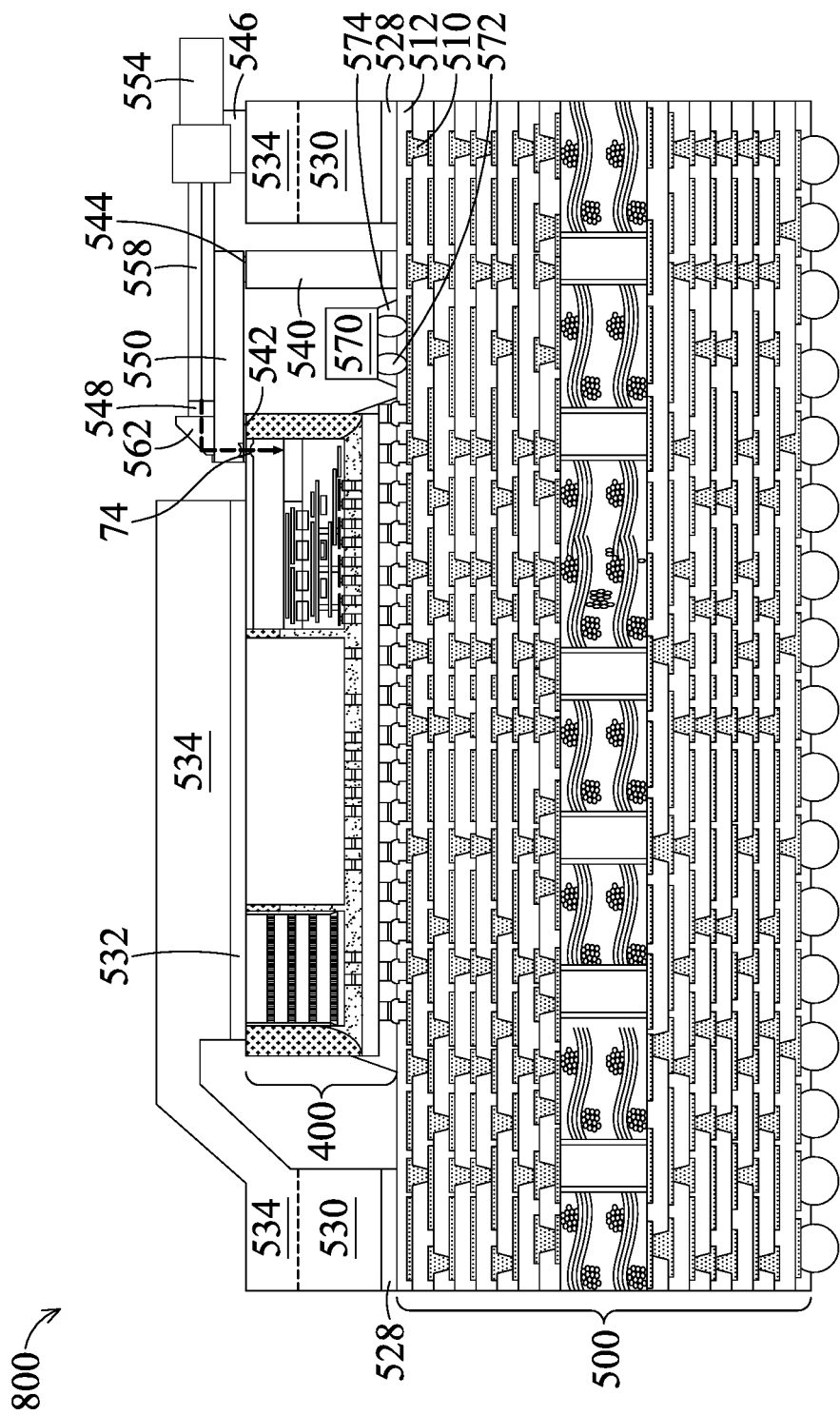
FIG. 22 illustrates a cross-sectional view of a package component, in accordance with some embodiments.

FIGS. 21 and 22 illustrate cross-sectional views of package components 800, in accordance with some embodiments. The package component 800 is similar to the package component 600 (see FIGS. 13 and 14), with similar features being labeled by similar numerical references, and descriptions of the similar features are not repeated herein. In some embodiments, the package component 800 may be formed using process steps that are similar to the process steps described above with reference to FIGS. 1-14, and the description is not repeated herein.

In FIG. 21, a passive component 570 is bonded to the package substrate 500 between the support structure 540 and the heat dissipation lid 534/warpage control structure 530. In FIG. 22, the passive component 570 is bonded to the package substrate 500 between the support structure 540 and the package component 400. The passive component 570 is below the optical fiber 558.

The passive component 570 may include one or more passive devices such as capacitors, resistors, inductors, or the like. The passive component 570 may be formed in a similar manner to the integrated circuit die 50, and the description is not repeated herein. The passive component 570 may be bonded to conductive features of the package substrate 500 by connectors 572. The connectors 572 may be similar to the conductive connectors 134 described above and the description is not repeated herein. The passive component 570 may be bonded to the package substrate 500 and have an underfill 574 surrounding the connectors 572. The bonding process of the passive component 570 may be similar to the bonding process of the package component 400 described above and the description is not repeated herein. The underfill 574 may be similar to the underfill 526 described above and the description is not repeated herein.

Figure 23:
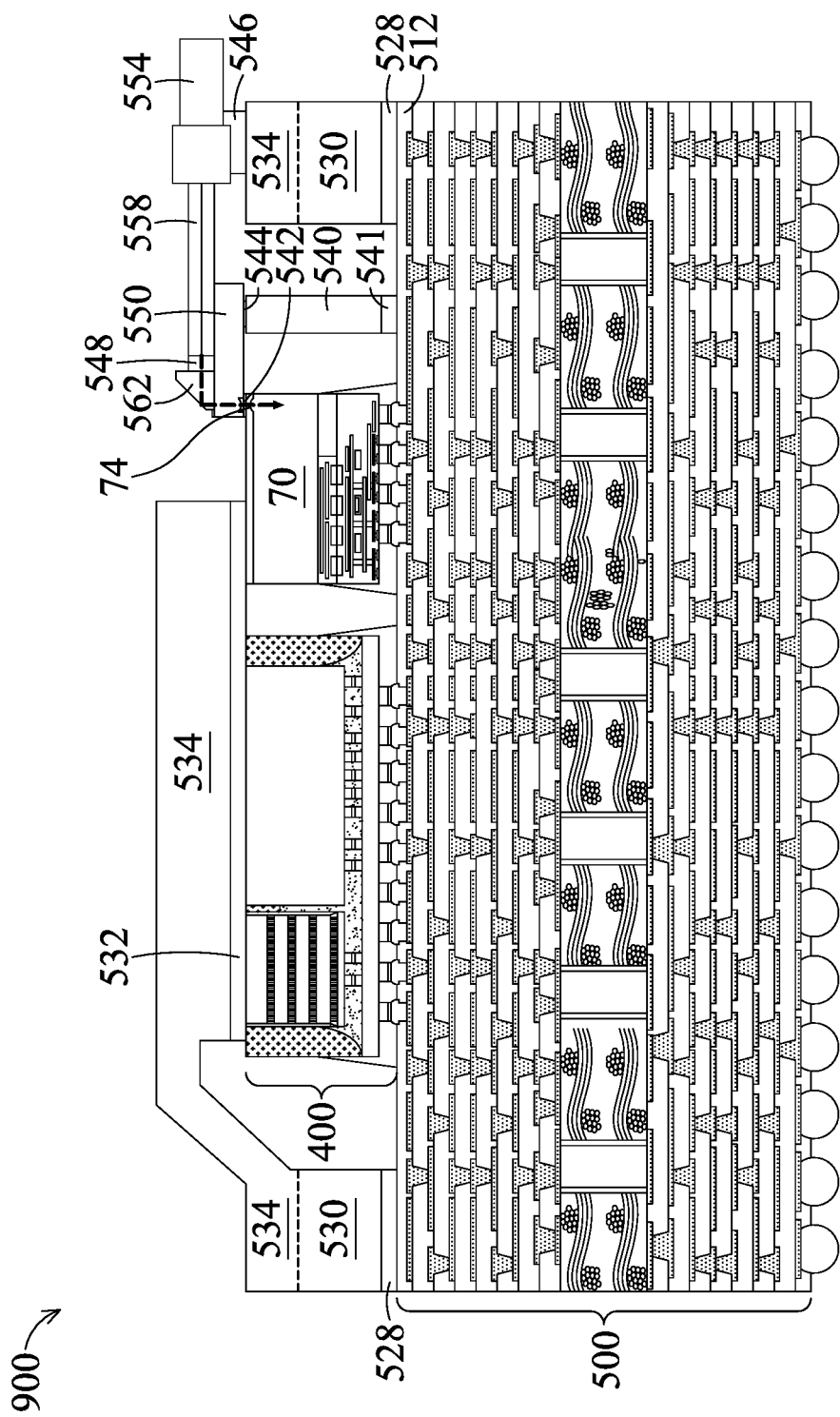
FIG. 23 illustrates a cross-sectional view of a package component, in accordance with some embodiments.

FIG. 23 illustrates a cross-sectional view of a package component 900, in accordance with some embodiments. The package component 900 is similar to the package component 600 (see FIGS. 13 and 14), with similar features being labeled by similar numerical references, and descriptions of the similar features are not repeated herein. In some embodiments, the package component 900 may be formed using process steps that are similar to the process steps described above with reference to FIGS. 1-14, and the description is not repeated herein. In the illustrated embodiment, the package component 400 is a multi-chip module with the optical engine 70 be a separate module from the dies 50 and 60. In this embodiment, the package including the dies 50 and 60 and the optical engine 70 are bonded separately to the package substrate 500.

Figure 24:
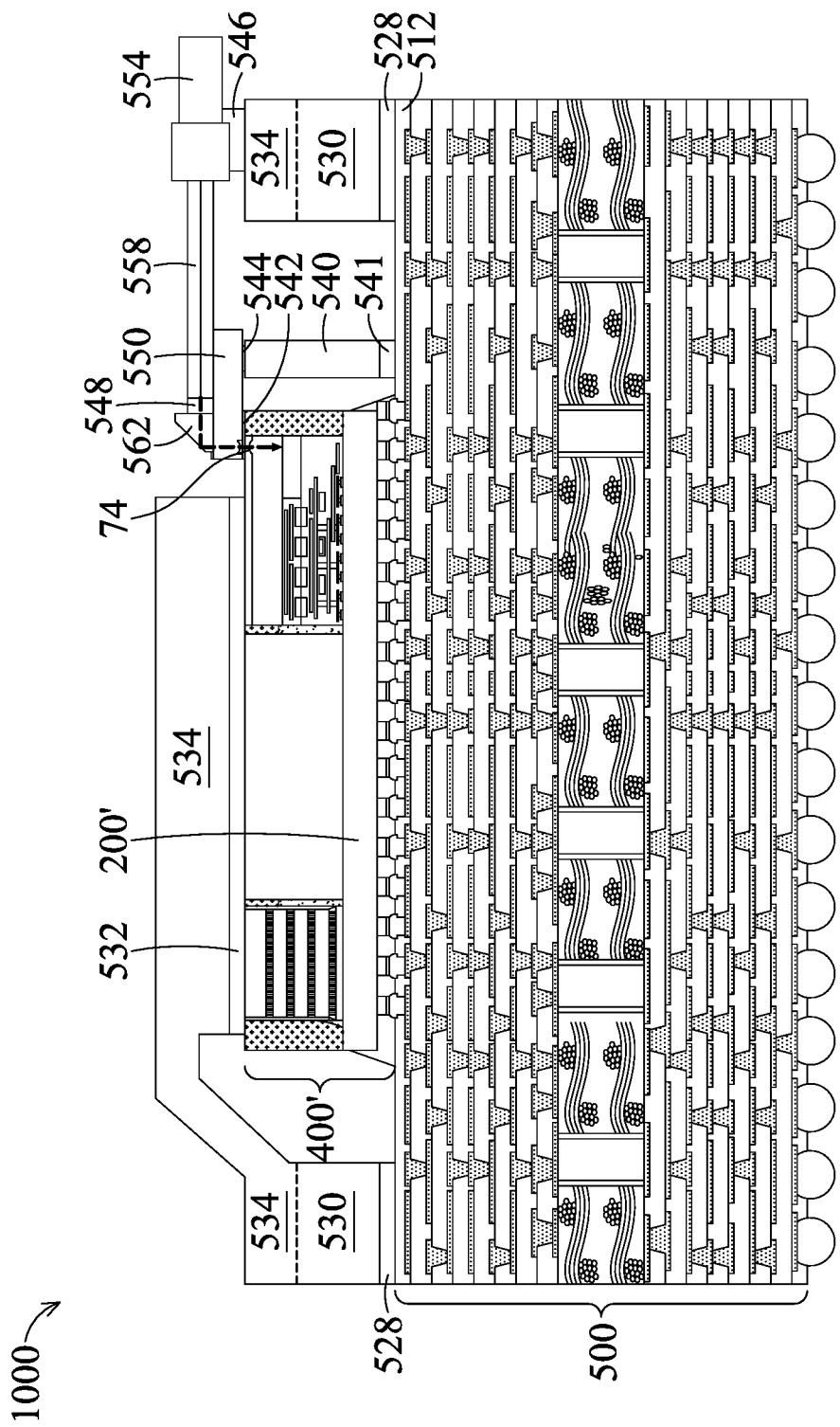
FIG. 24 illustrates a cross-sectional view of a package component, in accordance with some embodiments.

FIG. 24 illustrates a cross-sectional view of a package component 1000, in accordance with some embodiments. The package component 1000 is similar to the package component 600 (see FIGS. 13 and 14), with similar features being labeled by similar numerical references, and descriptions of the similar features are not repeated herein. In some embodiments, the package component 1000 may be formed using process steps that are similar to the process steps described above with reference to FIGS. 1-14, and the description is not repeated herein. In the illustrated embodiment, the package component 400' is an integrated fan-out (InFO) package instead of a chip-on-wafer package. For example, in this embodiment, the interposer 202 is replaced with a redistribution structure 200'.

In some embodiments, the redistribution structure 200' may be formed of alternating layers of dielectric material (e.g., low-k dielectric material) and conductive material (e.g., copper) with vias interconnecting the layers of conductive material, and may be formed through any suitable process (such as deposition, damascene, or the like). In other embodiments, the redistribution structure 200' may be formed of alternating layers of dielectric material (e.g., build up films such as Ajinomoto build-up film (ABF) or other laminates) and conductive material (e.g., copper) with vias interconnecting the layers of conductive material, and may be formed through any suitable process (such as lamination, plating, or the like).

Figure 25:
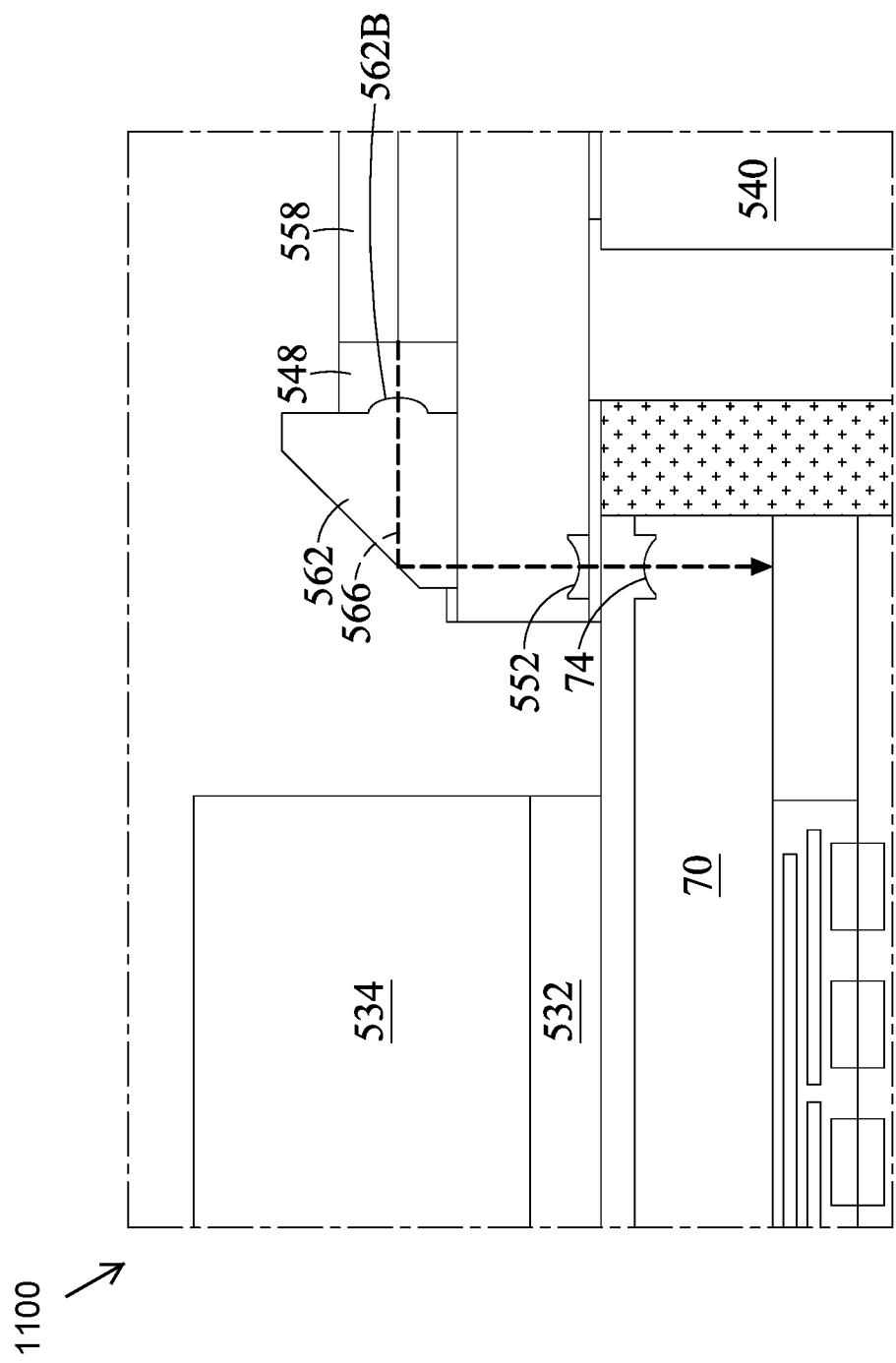
FIG. 25 illustrates a cross-sectional view of a package component, in accordance with some embodiments.

FIG. 25 illustrates a magnified view of a cross-sectional view of a package component 1100, in accordance with some embodiments. The package component 1100 is similar to the package component 600 (see FIGS. 13 and 14), with similar features being labeled by similar numerical references, and descriptions of the similar features are not repeated herein. In some embodiments, the package component 1100 may be formed using process steps that are similar to the process steps described above with reference to FIGS. 1-14, and the description is not repeated herein. In the illustrated embodiment, the lens 74 on the optical engine 70 is recessed into the optical engine 70.

Embodiments may achieve advantages. By forming a package (such as, for example, the package component 600 illustrated in FIGS. 13 and 14) comprising a lens adapter, a support structure, and a mirror as described above various advantages may be achieved. By including these components in specific configurations, the package structure can be more compact and utilize a lateral entry optical fiber to the package structure with a top surface entry to the optical engine for the optical data path from the optical fiber. Accordingly, improved coupling between the coupler of the optical integrated circuit die and an optical fiber is achieved. Various embodiments presented herein allow for integration of optical integrated circuit dies comprising grating couplers, achieving high bandwidth with ultra-low power consumption through the edge coupler, and extensive integration for co-package optics. Further, the optical loss from the optical fiber to the mirror is reduced as compared to other structures. In addition, the lens adapter and the mirror allow for the disclosed embodiments to be widely usable in various packaging configurations, such as multi-chip modules (MCM), chip-on-wafer-on-substrate packages, or integrated fan-out (InFO) packages.

An embodiment is a package including a package substrate. The package also includes a package component bonded to the package substrate, the package component including an interposer. The package also includes an optical die bonded to the interposer, the optical die including an optical coupler. The package also includes an integrated circuit die bonded to the interposer adjacent the optical die. The package also includes a lens adapter adhered to the optical die with a first optical glue. The package also includes a mirror adhered to the lens adapter with a second optical glue, the mirror being aligned with the optical coupler of the optical die. The package also includes an optical fiber on the lens adapter, a first end of the optical fiber facing the mirror, the optical fiber being configured such that an optical data path extends from the first end of the optical fiber through the mirror, the second optical glue, the lens adapter, and the first optical glue to the optical coupler of the optical die.

Embodiments may include one or more of the following features. The package where the optical die includes a first lens on a backside of the optical die, the backside of the optical die facing away from the package substrate, the optical data path going through the first lens. The lens adapter includes a second lens on a lower surface of the lens adapter, the optical data path going through the second lens. The mirror includes a third lens, the optical data path going through the third lens. The mirror is made of glass, silicon, quartz, acrylic, plastic, or a combination thereof. The package further including a support structure adhered to the package substrate, the lens adapter being over and adhered to the support structure. The heat dissipation lid includes an opening, a portion of the optical die being in the opening, the lens adapter being adhered to the portion of the optical die in the opening. The lens adapter extends across the opening in the heat dissipation lid and is adhered to an outer portion of the heat dissipation lid. The package further including a second underfill between the package substrate and the package component. The package component further includes a first underfill between the optical die, the integrated circuit die, and the interposer, and an encapsulant encapsulating the optical die, the integrated circuit die, and the first underfill, the lens adapter being adhered to the encapsulant. The lens adapter has grooves in a top surface of the lens adapter, the optical fiber being in one of grooves. The package where the mirror includes a recess, the optical fiber being in the recess of the mirror.

An embodiment is a package including a package substrate. The package also includes a package component bonded to the package substrate. The package also includes a heat dissipation lid attached to the package substrate and covering the package component, the heat dissipation lid including an opening, a portion of the package component being in the opening of the heat dissipation lid. The package also includes a lens adapter in the opening of the heat dissipation lid, the lens adapter being attached to the package component. The package also includes a mirror in the opening of the heat dissipation lid, the mirror being attached to the lens adapter. The package also includes an optical fiber extending to the opening in the heat dissipation lid, the optical fiber being on the lens adapter, where the package component includes an optical die including an optical coupler, the optical coupler being proximate a first sidewall of the optical die, the first sidewall of the optical die and the first sidewall of the package component in the opening of the heat dissipation lid, a first end of the optical fiber facing the mirror, the optical fiber being configured such that an optical data path extends from the first end of the optical fiber through the mirror and the lens adapter to the optical coupler of the optical die.

Embodiments may include one or more of the following features. The package further including a support structure on the package substrate in the opening of the heat dissipation lid, the lens adapter being attached to the support structure. The optical die includes a first lens on a backside of the optical die, the backside of the optical die facing away from the package substrate, the lens adapter including a second lens on a lower surface of the lens adapter, and the mirror including a third lens, the optical data path going through the first lens, the second lens, and the third lens. The optical data path is reflected in the mirror. The package component further includes an interposer, the optical die being bonded to the interposer, a logic die bonded to the interposer, a memory die bonded to the interposer, a first underfill between the optic al die, the logic die, the memory die, and the interposer, and an encapsulant encapsulating the optical die, the logic die, the memory die, and the first underfill, the lens adapter being attached to the encapsulant.

An embodiment includes a method of forming a package component, where forming the package component includes bonding an optical die to an interposer, the optical die including an optical coupler proximate to a first sidewall of the optical die. The method also includes bonding a logic die to the interposer. The method also includes depositing a first underfill between the optical die, the logic die, and the interposer. The method also includes forming an encapsulant on the optical die, the logic die, and the first underfill. The method also includes bonding the package component to a package substrate. The method also includes attaching a heat dissipation lid to the package substrate and the package component, the heat dissipation lid including an opening, a portion of the package component being in the opening of the heat dissipation lid. The method also includes attaching a support structure to the package substrate in the opening of the heat dissipation lid. The method also includes attaching a lens adapter to the portion of the package component in the opening and the support structure in the opening. The method also includes attaching a mirror to the lens adapter. The method also includes attaching an optical fiber to the mirror, the optical fiber being on the lens adapter, the optical fiber being configured such that an optical data path extends from a first end of the optical fiber through the mirror and the lens adapter to the optical coupler of the optical die.

Embodiments may include one or more of the following features. The method where the optical die includes a first lens on a backside of the optical die, the backside of the optical die facing away from the package substrate, the lens adapter including a second lens on a lower surface of the lens adapter, and the mirror including a third lens, the optical data path going through the first lens, the second lens, and the third lens. The lens adapter extends across the opening in the heat dissipation lid and is attached to an outer portion of the heat dissipation lid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a package substrate;
   a package component bonded to the package substrate, the package component comprising:
     an interposer;
     an optical die bonded to the interposer, the optical die comprising an optical coupler; and
     an integrated circuit die bonded to the interposer adjacent the optical die;
   a lens adapter adhered to the optical die with a first optical glue;
   a mirror adhered to the lens adapter with a second optical glue, the mirror being aligned with the optical coupler of the optical die; and
   an optical fiber on the lens adapter, a first end of the optical fiber facing the mirror, the optical fiber being configured such that an optical data path extends from the first end of the optical fiber through the mirror, the second optical glue, the lens adapter, and the first optical glue to the optical coupler of the optical die.

2. The package of claim 1, wherein the optical die includes a first lens on a backside of the optical die, the backside of the optical die facing away from the package substrate, the optical data path going through the first lens.

3. The package of claim 2, wherein the lens adapter includes a second lens on a lower surface of the lens adapter, the optical data path going through the second lens.

4. The package of claim 2, wherein the mirror includes a third lens, the optical data path going through the third lens.

5. The package of claim 1, wherein the mirror is made of glass, silicon, quartz, acrylic, plastic, or a combination thereof.

6. The package of claim 1 further comprising:
   a support structure adhered to the package substrate, the lens adapter being over and adhered to the support structure.

7. The package of claim 1 further comprising:
   a heat dissipation lid attached to the package substrate and covering the package component, wherein the heat dissipation lid comprises an opening, a portion of the optical die being in the opening, the lens adapter being adhered to the portion of the optical die in the opening.

8. The package of claim 7, wherein the lens adapter extends across the opening in the heat dissipation lid and is adhered to an outer portion of the heat dissipation lid.

9. The package of claim 1, wherein the package component further comprises:
   a first underfill between the optical die, the integrated circuit die, and the interposer; and
   an encapsulant encapsulating the optical die, the integrated circuit die, and the first underfill, the lens adapter being adhered to the encapsulant.

10. The package of claim 8 further comprising:
    a second underfill between the package substrate and the package component.

11. The package of claim 1, wherein the lens adapter has grooves in a top surface of the lens adapter, the optical fiber being in one of the grooves.

12. The package of claim 1, wherein the mirror comprises a recess, the optical fiber being in the recess of the mirror.

13. A package comprising:
a package substrate;
a package component bonded to the package substrate;
a heat dissipation lid attached to the package substrate and covering the package component, the heat dissipation lid comprising an opening, a portion of the package component being in the opening of the heat dissipation lid;
a lens adapter in the opening of the heat dissipation lid, the lens adapter being attached to the package component;
a mirror in the opening of the heat dissipation lid, the mirror being attached to the lens adapter; and
an optical fiber extending to the opening in the heat dissipation lid, the optical fiber being on the lens adapter, wherein the package component comprises:
an optical die comprising an optical coupler, the optical coupler being proximate a first sidewall of the optical die, the first sidewall of the optical die and a first sidewall of the package component in the opening of the heat dissipation lid, a first end of the optical fiber facing the mirror, the optical fiber being configured such that an optical data path extends from the first end of the optical fiber through the mirror and the lens adapter to the optical coupler of the optical die.

14. The package of claim 13 further comprising:
a support structure on the package substrate in the opening of the heat dissipation lid, the lens adapter being attached to the support structure.

15. The package of claim 14, wherein the optical die includes a first lens on a backside of the optical die, the backside of the optical die facing away from the package substrate, the lens adapter including a second lens on a lower surface of the lens adapter, and the mirror including a third lens, the optical data path going through the first lens, the second lens, and the third lens.

16. The package of claim 13, wherein the optical data path is reflected in the mirror.

17. The package of claim 13, wherein the package component further comprises:
an interposer, the optical die being bonded to the interposer;
a logic die bonded to the interposer;
a memory die bonded to the interposer;
a first underfill between the optical die, the logic die, the memory die, and the interposer; and
an encapsulant encapsulating the optical die, the logic die, the memory die, and the first underfill, the lens adapter being attached to the encapsulant.

18. A method comprising:
forming a package component, wherein forming the package component comprises:
bonding an optical die to an interposer, the optical die comprising an optical coupler proximate to a first sidewall of the optical die;
bonding a logic die to the interposer;
depositing a first underfill between the optical die, the logic die, and the interposer; and
forming an encapsulant on the optical die, the logic die, and the first underfill;
bonding the package component to a package substrate; and
attaching a heat dissipation lid to the package substrate and the package component, the heat dissipation lid comprising an opening, a portion of the package component being in the opening of the heat dissipation lid;
attaching a support structure to the package substrate in the opening of the heat dissipation lid;
attaching a lens adapter to the portion of the package component in the opening and the support structure in the opening;
attaching a mirror to the lens adapter; and
attaching an optical fiber to the mirror, the optical fiber being on the lens adapter, the optical fiber being configured such that an optical data path extends from a first end of the optical fiber through the mirror and the lens adapter to the optical coupler of the optical die.

19. The method of claim 18, wherein the optical die includes a first lens on a backside of the optical die, the backside of the optical die facing away from the package substrate, the lens adapter including a second lens on a lower surface of the lens adapter, and the mirror including a third lens, the optical data path going through the first lens, the second lens, and the third lens.

20. The method of claim 18, wherein the lens adapter extends across the opening in the heat dissipation lid and is attached to an outer portion of the heat dissipation lid.

* * * * *